12) United States Patent
Yamazaki et al.

(10) Patent No.: US 8,477,220 B2
(45) Date of Patent: Jul. 2, 2013

(54) SOLID-STATE IMAGE PICKUP DEVICE

(75) Inventors: Susumu Yamazaki, Tokyo (JP); Yoshio Hagihara, Tokyo (JP)

(73) Assignee: Olympus Corporation, Tokyo (JP)

( * ) Notice: Subject to any disclaimer, the term of this patent is extended or adjusted under 35 U.S.C. 154(b) by 22 days.

(21) Appl. No.: 13/348,227

(22) Filed: Jan. 11, 2012

(65) Prior Publication Data

US 2012/0176518 A1 Jul. 12, 2012

(30) Foreign Application Priority Data

Jan. 12, 2011 (JP) .................................. 2011-003983

(51) Int. Cl.
*H04N 5/217* (2011.01)
(52) U.S. Cl.
USPC ............................................................ 348/241
(58) Field of Classification Search
USPC .................. 348/241, 295, 294, 302
See application file for complete search history.

(56) References Cited

U.S. PATENT DOCUMENTS

| 7,400,359 | B1 * | 7/2008 | Adams | 348/441 |
| 2002/0022938 | A1 * | 2/2002 | Butler | 702/85 |
| 2009/0303361 | A1 * | 12/2009 | Saito et al. | 348/294 |
| 2010/0073542 | A1 * | 3/2010 | Watanabe | 348/311 |
| 2011/0164160 | A1 * | 7/2011 | Harada | 348/302 |
| 2013/0044248 | A1 * | 2/2013 | Tumer et al. | 348/302 |

FOREIGN PATENT DOCUMENTS

| JP | 2868266 B2 | 3/1999 |
| JP | 3064644 B2 | 7/2000 |
| JP | 3455982 B2 | 10/2003 |

* cited by examiner

*Primary Examiner* — Aung S Moe
*Assistant Examiner* — Amy Hsu
(74) *Attorney, Agent, or Firm* — Westerman, Hattori, Daniels & Adrian, LLP

(57) ABSTRACT

A solid state image pickup device may include a pixel unit that includes a plurality of pixels; a pulse delay unit that includes a plurality of delay elements, each of the plurality of delay elements including a power supply terminal; a stop control unit; a stop signal delay unit; a lower bit latch unit; a counter unit; a first upper bit latch unit; a second upper bit latch unit; and a correcting unit that compares an output signal of the first upper bit latch unit with an output signal of the second upper bit latch unit, and corrects a count value, which is a count result of the counter unit, based on a comparison result and an output signal of the lower bit latch unit.

12 Claims, 24 Drawing Sheets

SOLID-STATE IMAGE PICKUP DEVICE

BACKGROUND OF THE INVENTION

1. Field of the Invention

The present invention relates to a solid state image pickup device that performs analog-to-digital (A/D) conversion converting an analog voltage signal output from a pixel into binary digital data.

Priority is claimed on Japanese Patent Application No. 2011-003983, filed Jan. 12, 2011, the content of which is incorporated herein by reference.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

In recent years, image pickup devices, such as digital cameras and digital video cameras, that acquire an imaged image as digital data using a solid state image pickup device (hereinafter referred to as an "image sensor"), and store or edit the image have been in widespread use. As an image sensor used in the image pickup device, charge coupled device (CCD) image sensors have been most commonly and widely used. However, in recent years, there have been demands for a reduction in the size of the image sensor and low power consumption, and thus complementary metal oxide semiconductor (CMOS) image sensors have attracted attention and become widespread. With the size reduction and low power consumption of the image pickup device, a compact A/D converter of low power consumption has been suggested as an A/D converter used in the image sensor (for example, see Japanese Patent No. 3064644).

The A/D converter includes a pulse delay unit configured by a plurality of inverting circuits (delay elements) which are connected in a ring form. An analog input signal, which is an input signal, is applied to each inverting circuit (a delay element) as a power voltage. Using a phenomenon in which a delay time of a pulse in an inverting circuit (delay element) changes depending on the power voltage, the number of times that the pulse has circulated in the pulse delay unit within a time period for performing A/D conversion (hereinafter referred to as a "sampling time period") is counted. The count value is used as a upper bit, and a value obtained by encoding a position of the pulse inside the pulse delay unit is used as a lower bit. A/D conversion of the analog input signal is performed by synthesizing output values of the upper bit and the lower bit.

Further, a pulse phase difference encoding circuit using the above described pulse delay unit that causes a first pulse input at an arbitrary timing to circulate in the pulse delay unit, counts the circulation number, specifies a circulation position of the first pulse at an input timing of a second pulse input with an arbitrary phase difference, and detects a phase difference between the two pulses using the specified position and a count number of the circulation number of the first pulse has been suggested (for example, see Japanese Patent No. 2868266 and Japanese Patent No. 3455982).

In particular, in Japanese Patent No. 2868266, two counter units for counting a circulation number of a pulse are provided. The two counter units perform a count operation at different timings, and only an output value of the counter unit having a stabilized output value when the count operation is finished is used. Thus, the phase difference can be accurately detected by constantly using the counter value of a stabilized state.

In Japanese Patent No. 3455982, one counter unit for counting a circulation number of a pulse and two latch units for latching an output value of the counter unit are provided. By operating the two latch units at different timings, it is possible to constantly use the count value of a stabilized state, and thus the same effect as in Japanese Patent No. 2868266 is obtained. When the technique disclosed in Japanese Patent No. 2868266 and Japanese Patent No. 3455982 is applied to the technique disclosed in Japanese Patent No. 3064644, an improvement in the conversion accuracy of the A/D converter can be similarly secured.

However, when the above described A/D converter is employed in a CMOS image sensor (a CMOS image sensor of a column analog-to-digital converter (ADC) type) which is an example of a CMOS image sensor and includes an A/D converter arranged for each pixel column or for a plurality of pixel columns, the following problems occur. The problems will be described below.

FIG. 23 is a block diagram illustrating an example of a CMOS image sensor using the above described A/D converter. The CMOS image sensor illustrated in FIG. 23 includes a pixel unit 001, a vertical scanning unit 003, an analog signal processing unit 004, an A/D converter 005, a memory unit 006, an output unit 007, a horizontal scanning unit 008, and a control unit 009.

The pixel unit 001 includes a plurality of pixels 002 arranged in the form of a matrix. The pixel 002 generates a pixel signal based on light incident thereto. Each pixel 002 is connected to a pixel signal output line (a vertical signal line) arranged for each pixel column. The pixel signal generated from each pixel 002 is output to the corresponding pixel signal output line.

The vertical scanning unit 003 outputs various kinds of control signals to the pixel 002 and controls an exposure operation or a signal read operation of the pixel 002. The analog signal processing unit 004 performs a process such as a sample-and-hold operation on an analog pixel signal output from the pixel 002. The A/D converter 005 A/D-converts the analog pixel signal processed by the analog signal processing unit 004, and generates digital data. The memory unit 006 stores the digital data which is the A/D conversion result. The output unit 007 outputs the digital data stored in the memory unit 006 to a processing circuit of a subsequent stage. The horizontal scanning unit 008 controls reading of the digital data from the memory unit 006. The control unit 009 outputs control signals 010 and 011 to the A/D converter 005, and thus controls an operation of the A/D converter 005.

In the CMOS image sensor of this example, the A/D converter 005, the analog signal processing unit 004, and the memory unit 006 are provided for each pixel column. In each column, the analog signals from the pixels 002 are output to the analog signal processing unit 004. The analog signal processing unit 004 processes the analog signals, and outputs the processed analog signals to the A/D converter 005. The A/D converter 005 is controlled by the control unit 009, A/D-converts the input signal while the control signals 010 and 011 from the control unit 009 have a high (H) level, and outputs the A/D-converted digital data to the memory unit 006. Operation start and operation stop of a counter unit 0052 constituting the A/D converter 005 are controlled by the control signal 010, and operation start and operation stop of a pulse delay unit/latch unit 0051 constituting the A/D converter 005 are controlled by the control signals 010 and 011.

In the A/D converter of the CMOS image sensor having the above described configuration, the pulse delay unit/latch unit 0051 and the counter unit 0052 are arranged in a line in a vertical direction as illustrated in FIG. 23. For this reason, a delay corresponding to a difference in the line length of the control signal 010 occurs. Due to the delay, a timing at which the control signal 010 reaches the pulse delay unit/latch unit 0051 is different from a timing at which the control signal 010 reaches the counter unit 0052 (specifically, a timing at which the control signal 010 reaches the counter unit 0052 is delayed), so that an error may occur in the A/D conversion result.

This problem will be described with reference to FIG. 24. FIG. 24 is a timing chart for explaining the problem of the related art. In FIG. 23, the line of the control signal 010 to the counter unit 0052 is longer than the line of the control signal 010 to the pulse delay unit/latch unit 0051, and thus a time difference of Δt occurs in the control signal 010 between a point A and a point B. That is, the control signal 010 reaches the counter unit 0052 at a timing which is delayed by Δt from a timing at which the control signal 010 reaches the pulse delay unit/latch unit 0051.

As illustrated in FIG. 24, when the counter unit 0052 counts the output signal from the pulse delay unit during the delay Δt, an output value (11 in FIG. 24) of the counter unit 0052 is one count larger than a normal output value (10 in FIG. 24). The error of one count in the counter unit 0052 results in a deviation corresponding to an output bit of a lower bit of digital data from the point of view of an output result of the A/D converter in which an output value of the counter unit 0052 (which is the upper bit of the digital data) is synthesized with an encoding result of a pulse position of the pulse delay unit/latch unit 0051 (which is the lower bit of the digital data).

In FIGS. 23 and 24, the counter unit 0052 performs erroneous count by +1 due to the delay of the control signal 010, and the error occurs in the A/D conversion result. However, depending on the line layout of the control signal 010, the delay of the control signal 010 may occur in the pulse delay unit/latch unit 0051, and the counter unit 0052 may perform erroneous count (minus one different), leading to an error in the A/D conversion result.

When the delay of the control signal 010 occurs in the pulse delay unit/latch unit 0051, the error in the A/D conversion result can be prevented by applying the technique disclosed in Japanese Patent No. 2868266 to the technique disclosed in Japanese Patent No. 3064644. However, when the delay of the control signal 010 occurs in the counter unit 0052, the error occurs in the A/D conversion result as described above.

Further, even when there is no difference (or a small difference) in the line length of the signal line, a random signal deviation may occur due to overlapping of a clock signal from another signal line. In this case, in the example of the delay of the control signal 010 between the points A and B of FIG. 23, even though the length from a reference point to the point A is the same as the length from the reference point to the point B, when the control signal 010 at the point A is delayed compared to the control signal 010 at the point B due to influence of the clock signal overlapping midstream, the control signal 010 at the point B may be delayed compared to the control signal 010 at the point A.

In addition, in the pulse phase difference encoding circuit disclosed in Japanese Patent No. 2868266, the two count units are provided. Thus, in the CMOS image sensor of the column ADC type of the above described example, when the A/D converter is arranged for each pixel column or for a plurality of pixel columns, the size of the A/D converter increases, leading to an increase in the chip size.

SUMMARY

The present invention provides a solid state image pickup device capable of performing A/D conversion with a high degree of accuracy and suppressing an increase in the size to a minimum.

A solid state image pickup device may include: a pixel unit that includes a plurality of pixels arranged in the form of a matrix, each of the plurality of pixels generating a pixel signal, the pixel signal being output from a plurality of pixel signal output lines arranged to correspond to a column of the plurality of pixels; a pulse delay unit that includes a plurality of delay elements connected in a ring form, each of the plurality of delay elements including a power supply terminal that is connected to one of the plurality of pixel signal output lines, one of the plurality of delay elements including an input terminal that receives a pulse, each of the plurality of delay elements transferring the pulse with a delay time corresponding to the pixel signal; a stop control unit that outputs a stop signal when a predetermined time elapses after the pulse delay unit receives the pulse; a stop signal delay unit that outputs a delay stop signal delayed from the stop signal; a lower bit latch unit that latches output signals of the plurality of delay elements when receiving the delay stop signal; a counter unit that counts a circulation number of the pulse based on an output signal of one of the plurality of delay elements; a first upper bit latch unit that latches at least a least significant bit of an output signal of the counter unit when receiving the delay stop signal; a second upper bit latch unit that latches the output signal of the counter unit when receiving the delay stop signal; and a correcting unit that compares an output signal of the first upper bit latch unit with an output signal of the second upper bit latch unit, and corrects a count value, which is a count result of the counter unit, based on a comparison result and an output signal of the lower bit latch unit.

The first upper bit latch unit may latch only the least significant bit of the output signal of the counter unit.

The stop signal delay unit may be connected to the plurality of lower bit latch units and the plurality of second upper bit latch units.

The stop signal delay unit may control a delay amount for delaying the stop signal based on the pixel signal.

A solid state image pickup device may include: a pixel unit that includes a plurality of pixels arranged in the form of a matrix, each of the plurality of pixels generating a pixel signal, the pixel signal being output from a plurality of pixel signal output lines arranged to correspond to a column of the plurality of pixels; a pulse delay unit that includes a plurality of delay elements connected in a ring form, each of the plurality of delay elements including a power supply terminal that is connected to one of the plurality of pixel signal output lines, one of the plurality of delay elements including an input terminal that receives a pulse, each of the plurality of delay elements transferring the pulse with a delay time corresponding to the pixel signal; a stop control unit that outputs a stop signal when a predetermined time elapses after the pulse delay unit receives the pulse; a stop signal delay unit that outputs a first delay stop signal delayed from the stop signal and a second delay stop signal delayed from the first delay stop signal; a lower bit latch unit that latches output signals of the plurality of delay elements when receiving the first delay stop signal; a first counter/latch unit that counts a circulation number of the pulse based on an output signal of one of the plurality of delay elements, and latches the circulation number when receiving the first delay stop signal; a second counter/latch unit that is smaller in the number of bits than the first counter/latch unit, counts a circulation number of the pulse based on an output signal of one of the plurality of delay elements, and latches the circulation number when receiving the stop signal; a third counter/latch unit that is smaller in the number of bits than the first counter/latch unit, counts a circulation number of the pulse based on an output signal of one of the plurality of delay elements, and latches the circulation number when receiving the second delay stop signal; and a correcting unit that compares an output signal of the first counter/latch unit, an output signal of the second counter/latch unit, and an output signal of the third counter/latch unit, and corrects a count value, which is a count result of the first counter/latch unit, based on a comparison result and an output signal of the lower bit latch unit.

The number of bits of the second counter/latch unit and the third counter/latch unit may be one.

The stop signal delay unit may be connected to the plurality of lower bit latch units, the plurality of first counter/latch units, and the plurality of third counter/latch units.

The stop signal delay unit may control a delay amount for delaying the stop signal and the first delay stop signal based on the pixel signal.

A solid state image pickup device may include: a pixel unit that includes a plurality of pixels arranged in the form of a matrix, each of the plurality of pixels generating a pixel signal, the pixel signal being output from a plurality of pixel signal output lines arranged to correspond to a column of the plurality of pixels; a pulse delay unit that includes a plurality of delay elements connected in a ring form, each of the plurality of delay elements including a power supply terminal that is connected to one of the plurality of pixel signal output lines, one of the plurality of delay elements including an input terminal that receives a pulse, each of the plurality of delay elements transferring the pulse with a delay time corresponding to the pixel signal; a stop control unit that outputs a stop signal when a predetermined time elapses after the pulse delay unit receives the pulse; a stop signal delay unit that outputs a first delay stop signal delayed from the stop signal and a second delay stop signal delayed from the first delay stop signal; a lower bit latch unit that latches output signals of the plurality of delay elements when receiving the first delay stop signal; a first counter/latch unit that counts a circulation number of the pulse based on an output signal of one of the plurality of delay elements, and latches the circulation number when receiving the second delay stop signal; a second counter/latch unit that is smaller in the number of bits than the first counter/latch unit, counts a circulation number of the pulse based on an output signal of one of the plurality of delay elements, and latches the circulation number when receiving the stop signal; a correcting unit that compares an output signal of the first counter/latch unit with an output signal of the second counter/latch unit, and corrects a count value which is a count result of the first counter/latch unit based on a comparison result and an output signal of the lower bit latch unit.

The number of bits of the second counter/latch unit may be one.

The stop signal delay unit may be connected to the plurality of lower bit latch units and the plurality of first counter/latch units.

The stop signal delay unit may control a delay amount for delaying the stop signal based on the pixel signal.

According to the present invention, by comparing the output signal of the first upper bit latch unit with the output signal of the second upper bit latch unit and correcting the count value based on the comparison result and the output signal of the lower bit latch unit, it is possible to obtain the count value when the lower bit latch unit latches the output signals of the plurality of delay elements, and thus A/D conversion can be performed with a high degree of accuracy. Further, since the number of bits of the first upper bit latch unit 105 can be reduced to be smaller than the number of bits of the counter unit, an increase in the size of the solid state image pickup device can be minimally-suppressed.

According to the present invention, by comparing the output signal of the first counter/latch unit, the output signal of the second counter/latch unit, and the output signal of the third counter/latch unit and correcting the count value based on the comparison result and the output signal of the lower bit latch unit, it is possible to obtain the count value when the lower bit latch unit latches the output signals of the plurality of delay elements, and thus A/D conversion can be performed with a high degree of accuracy. Further, since the number of bits of the second counter/latch unit and the number of bits of the third counter/latch unit can be reduced to be smaller than the number of bits of the first counter/latch unit, an increase in the size of the solid state image pickup device can be minimally-suppressed.

According to the present invention, by comparing the output signal of the first counter/latch unit with the output signal of the second counter/latch unit and correcting the count value based on the comparison result and the output signal of the lower bit latch unit, it is possible to obtain the count value when the lower bit latch unit latches the output signals of the plurality of delay elements, and thus A/D conversion can be performed with a high degree of accuracy. Further, since the number of bits of the second counter/latch unit can be reduced to be smaller than the number of bits of the first counter/latch unit, an increase in the size of the solid state image pickup device can be minimally-suppressed.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The present invention will be now described herein with reference to illustrative preferred embodiments. Those skilled in the art will recognize that many alternative preferred embodiments can be accomplished using the teaching of the present invention and that the present invention is not limited to the preferred embodiments illustrated for explanatory purpose.

First Preferred Embodiment

Figure 1:
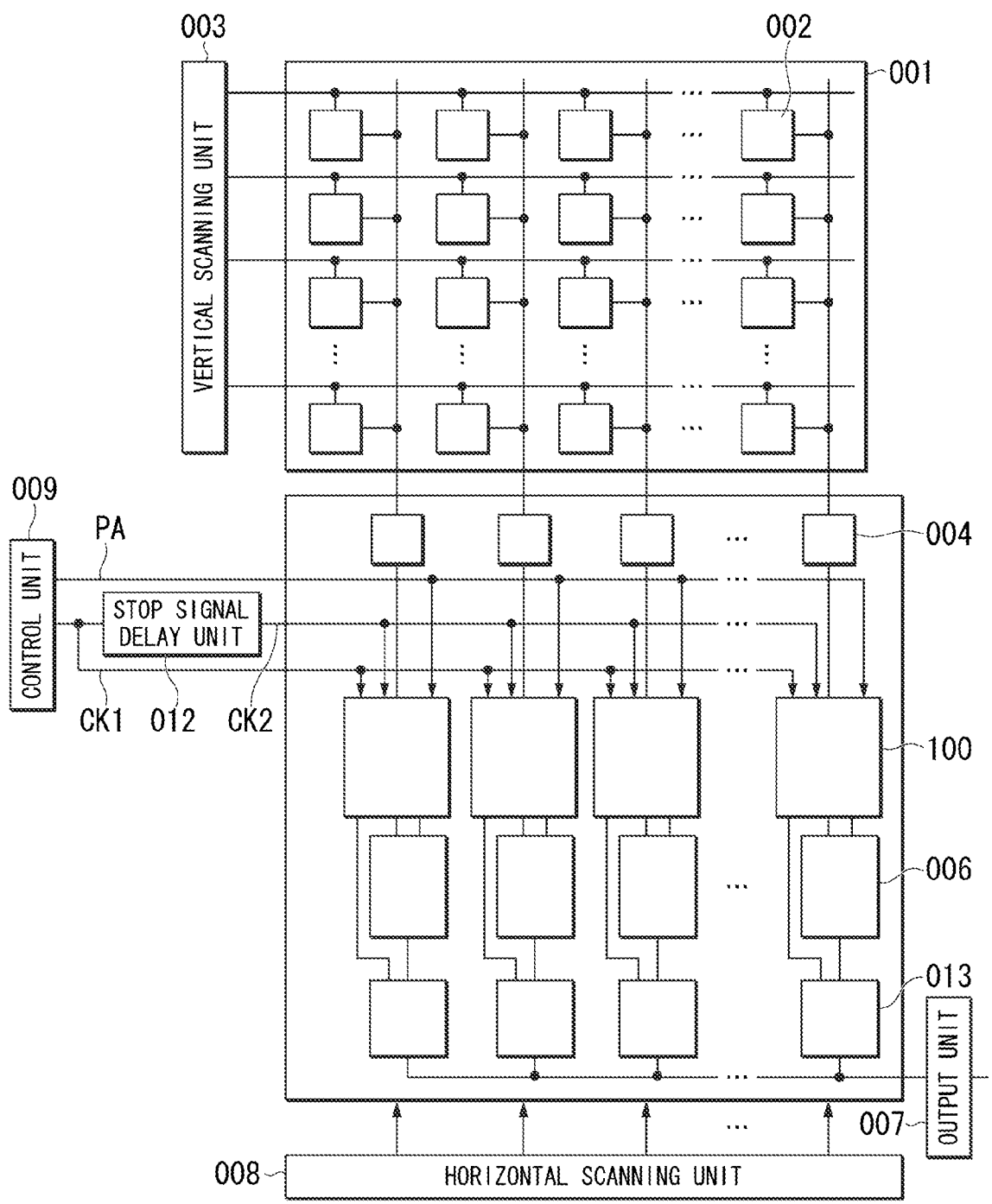
FIG. 1 is a block diagram illustrating a configuration of a solid state image pickup device in accordance with the first preferred embodiment of the present invention.
Figure 2:
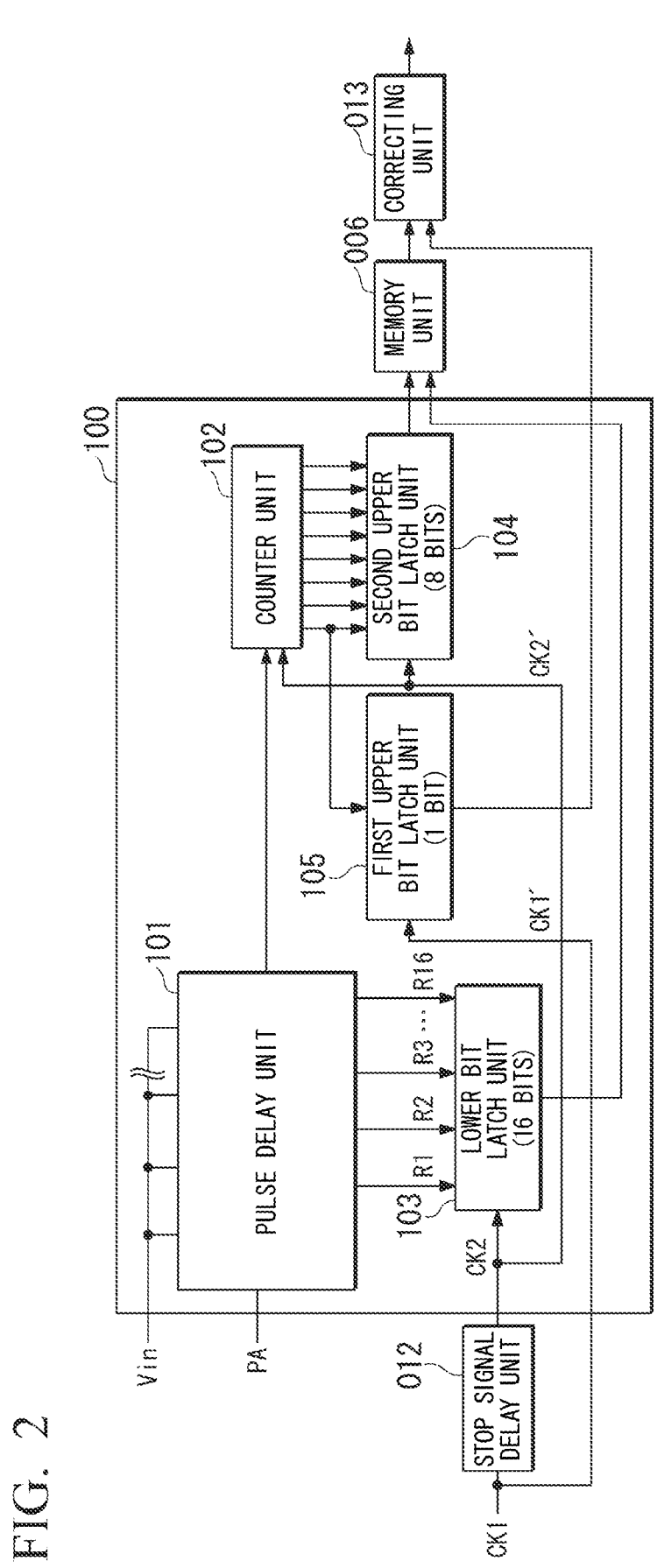
FIG. 2 is a block diagram illustrating a configuration of an A/D converter arranged in the solid state image pickup device in accordance with the first preferred embodiment of the present invention.

A first preferred embodiment of the present invention will be described. FIG. 1 is a block diagram illustrating a configuration of a solid state image pickup device in accordance with the first preferred embodiment of the present invention. FIG. 2 is a block diagram illustrating a configuration of an A/D converter arranged in the solid state image pickup device in accordance with the first preferred embodiment of the present invention. Components in the drawings will be described below. For convenience of description, preferred embodiments of the present invention will be described in connection with a detailed configuration of a solid state image pickup device, and a detailed configuration and operation of an A/D converter. That is, a detailed operation of a solid state image pickup device is the same as an operation of a solid state image pickup device of the related art or the above described operation, and thus a description thereof will be omitted here.

In addition, in preferred embodiments of the present invention, it is assumed that the maximum number of bits of digital data which an A/D converter can output as an A/D conversion result is specifically 12 for convenience of description. The number of bits may be set to 12 or more, or the number of bits may be 12 or less. When the optimum number of bits is set according to a utilization form, the same effect is obtained.

Similarly, a description will be made in connection with an example in which the number of bits output from a lower bit latch unit in an A/D converter is specifically 16. However, the number of bits output from a lower bit latch unit is not limited thereto, similarly to the maximum number of bits of digital data which can be output from an A/D converter.

The solid state image pickup device in accordance with the first preferred embodiment of the present invention will be described with reference to FIG. 1. In FIG. 1, the same components as in FIG. 23 are denoted by the same reference numerals, and thus the redundant description will not be repeated.

Figure 23:
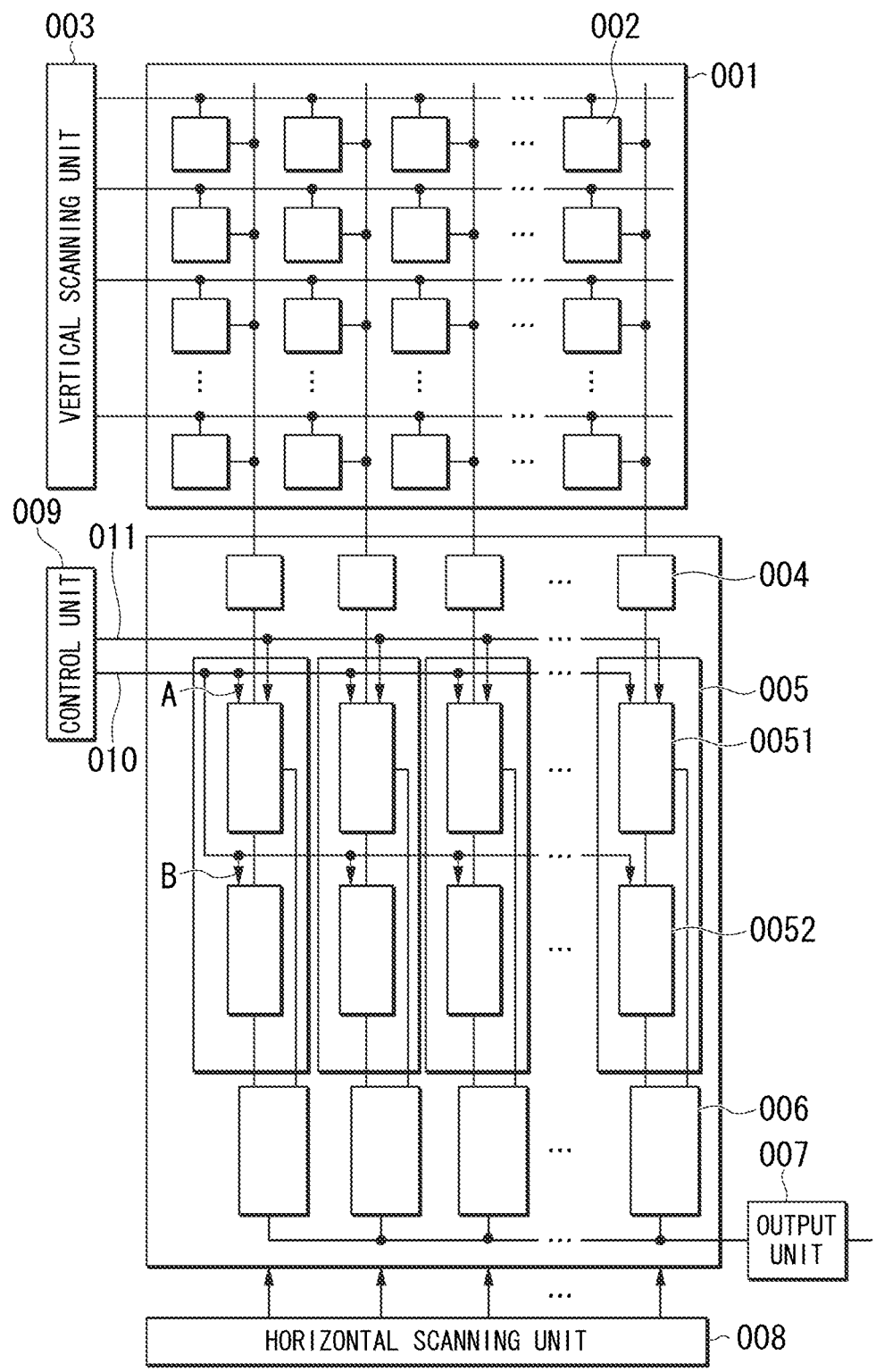
FIG. 23 is a block diagram illustrating a configuration of a CMOS image sensor in accordance with the related art.
Figure 24:
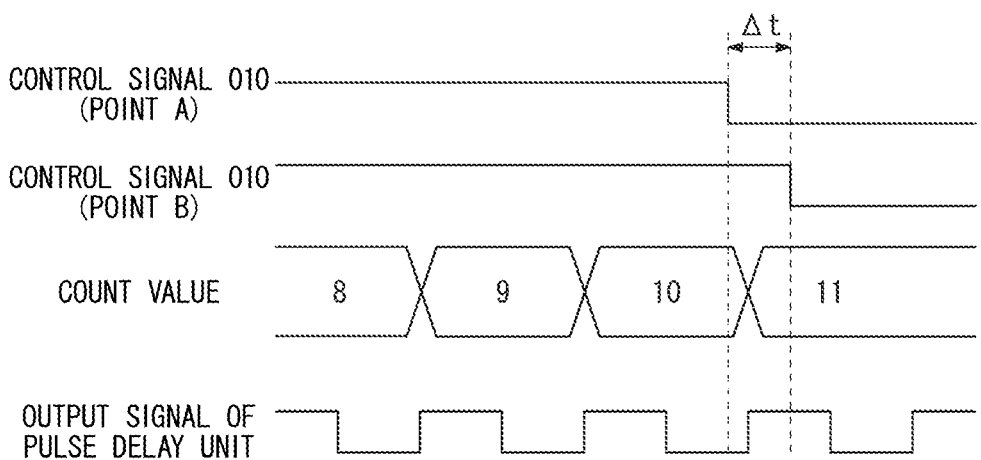
FIG. 24 is a timing chart for explaining the problem of the related art.

A difference between FIG. 1 and FIG. 23 lies in that a stop signal delay unit 012 and a correcting unit 013 are newly arranged, and the A/D converter 005 is replaced with an A/D converter 100. A start pulse signal PA is output from a control unit 009 functioning as a stop control unit to the A/D converter 100 of each column, and a signal CK1 functioning as a sampling clock is output to the stop signal delay unit 012 and the A/D converter 100 of each column. Control is performed such that a sampling operation starts in response to the start pulse signal PA, and when a predetermined time elapses after the sampling operation starts, the sampling operation is stopped in response to the signal CK1.

The stop signal delay unit 012 outputs a signal CK2, which is delayed from the signal CK1 by a predetermined time, to the A/D converter 100 of each column. In the first preferred embodiment of the present invention, it is assumed that the predetermined time by which the stop signal delay unit 012 delays the signal CK1 is set to a time corresponding to half a period of a pulse output from a pulse delay unit 101, which will be described later, when a highest analog input signal Vin is input to the pulse delay unit 101. In the following description, the time by which the stop signal delay unit 012 delays the signal CK1 is represented as $\Delta t_{d1}$.

The connecting unit 013 corrects a count value using an output signal of the A/D converting unit 100 and an output signal of a memory unit 006, and outputs an output signal based on the corrected count value to an output unit 007. As a result, it is possible to correct an error occurring in the count value due to the delay of the signal CK1 for controlling the count operation of a count unit 102 which will be described later. An operation of the correcting unit 013 will be described later.

Next, a configuration of the A/D converter in accordance with the first preferred embodiment of the present invention will be described with reference to FIG. 2. The A/D converter 100 includes a pulse delay unit 101, the count unit 102, a lower bit latch unit 103, a second upper bit latch unit 104, and a first upper bit latch unit 105. In FIG. 2, the stop signal delay unit 012, the memory unit 006, and the correcting unit 013 are illustrated again as components around the A/D converter 100.

When the signal CK1 and the signal CK2 delayed from the signal CK1 by a predetermined time reach the counter unit 102 and the second upper bit latch unit 104, and the first upper bit latch unit 105, respectively, the delay occurs due to the difference in the line length of the signal line or the random delay. In the following description, a delay when the signal CK1 reaches the first upper bit latch unit 105 is represented as $\Delta t_1$, and a delay when the signal CK2 reaches the counter unit 102 and the second upper bit latch unit 104 is represented as $\Delta t_2$. A signal delayed from the signal CK1 by $\Delta t_1$ is represented as a signal CK1', and a signal delayed from the signal CK2 by $\Delta t_2$ is represented as a signal CK2'.

Figure 3:
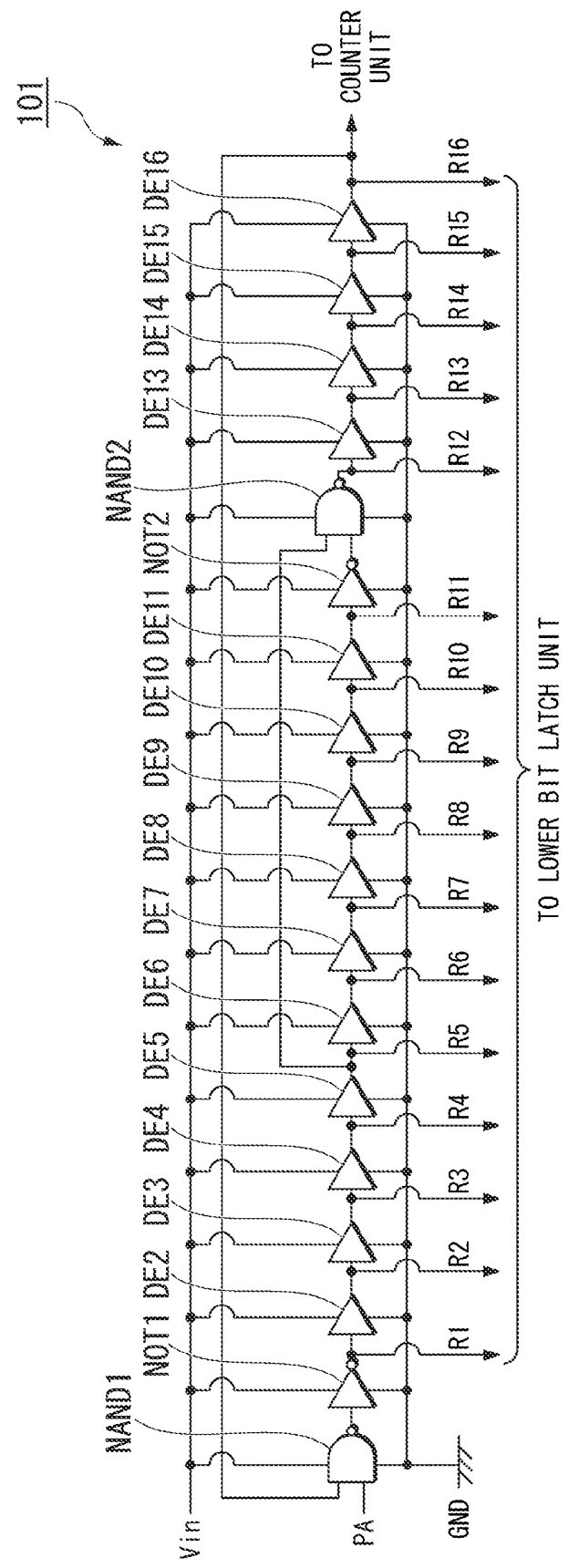
FIG. 3 is a circuit diagram illustrating a configuration of a pulse delay unit in the A/D converter arranged in the solid state image pickup device in accordance with the first preferred embodiment of the present invention.

FIG. 3 is a circuit diagram illustrating a configuration of the pulse delay unit 101 in the A/D converter arranged in the solid state image pickup device in accordance with the first preferred embodiment of the present invention. The pulse delay unit 101 functions as a circuit for delaying an input signal, and is configured to include 2-input NAND circuits NAND1 and NAND2, inverting circuits NOT1 and NOT2, and delay units DE2 to DE11 and DE13 to DE16 configured such that an even number of inverting circuits are connected in series.

One power supply terminal of the pulse delay unit 101 is connected to an analog input signal Vin which is a pixel signal output from the analog signal processing unit 004, and another is connected to a ground (GND). The analog input signal Vin is input as a power voltage of the pulse delay unit 101. In the pulse delay unit 101, the 2-input NAND circuits NAND1 and the inverting circuit NOT1 are connected to each other in series, and the inverting circuit NOT1 and the delay units DE2 to DE11 are connected to one another in series. An output terminal of the delay unit DE11 is connected to an input terminal of the inverting circuit NOT2, and an output terminal of the inverting circuit NOT2 is connected to one input terminal of the 2-input NAND circuit NAND2. The other input terminal of the 2-input NAND circuit NAND2 is connected to an output terminal of the delay unit DE5.

An output terminal of the 2-input NAND circuit NAND2 is connected to an input terminal of the delay unit DE13, and the delay units DE13 to DE16 are also connected to one another in series. An output terminal of the delay unit DE16 is connected to an input terminal of the counter unit 102 and one input terminal of the 2-input NAND circuit NAND1. The pulse delay unit 101 configures a circuit of a ring form. The start pulse signal PA representing the start of A/D conversion is input to the other input terminal of the 2-input NAND circuit NAND1. Further, output terminals of the inverting circuit NOT1, the delay units DE2 to DE11, the 2-input NAND circuit NAND2, and the delay units DE13 to DE16 are connected to the lower bit latch unit 103.

The 2-input NAND circuit NAND1 and the inverting circuit NOT1 configure a delay element of a first stage. The delay units DE2 to DE11 configure delay elements of second to eleventh stages, respectively. The inverting circuit NOT2 and the 2-input NAND circuit NAND12 configure a delay element of a twelfth stage. The delay units DE13 to DE16 configure delay elements of thirteenth to sixteenth stages. As described above, the delay elements are connected to one another in a ring form, and a delay element of a stage previous to the delay element of the first stage is the delay element of the sixteenth stage. Each delay element applies a delay time based on the analog input signal Vin input to the power supply terminal to the pulse signal output from the delay element of a previous stage, and outputs the delayed pulse signal.

The lower bit latch unit 103 latches output signals R1 to R16 from the pulse delay circuit 101 in synchronization with a period of the signal CK2. Further, the lower bit latch unit 103 sequentially outputs signals corresponding to the position of the pulse in the pulse delay unit 101 to the memory unit 006 bit by bit.

An output signal of the delay unit DE 16 of the last stage of the pulse delay unit 101 is input to the counter unit 102. The counter unit 102 counts the output signal of the delay unit DE16, and outputs the count result to the second upper bit latch unit 104 and the first upper bit latch unit 105 in synchronization with the period of the signal CK2'. At the time of counting, the counter unit 102 detects a transition of the pulse from a low (L) level to a high (H) level, and increases the count value by one. The count result of the counter unit 102 represents the number of times (circulation number) that the pulse has circulated in the delay elements of the pulse delay unit 101.

The second upper bit latch unit 104 is configured by a circuit having the number of bits which is equal to the number of bits of a signal which the counter unit 102 outputs as the counter result. The second upper bit latch unit 104 stores an output signal of all bits of the counter unit 102 in synchronization with the period of the signal CK2', and sequentially outputs the signal to the memory unit 006 bit by bit.

The first upper bit latch unit 105 is configured as a circuit of one bit. The first upper bit latch unit 105 stores a status of a least significant bit of the output signal of the counter unit 102 in synchronization with the period of the signal CK1', and outputs the signal based on the stored status to the correcting unit 013. That is, the first upper bit latch unit 105 stores the status of the least significant bit of the output signal of the counter unit 102 at a point in time which is $\Delta t_{d1}$ earlier than a point in time at which the second upper bit latch unit 104 stores the status of the least significant bit of the output signal of the counter unit 102.

The memory unit 006 sequentially stores the output signal of the lower bit latch unit 103 and the output signal of the second upper bit latch unit 104, and outputs the output signals to the correcting unit 013. The correcting unit 013 corrects the count value, which is the count result of the counter unit 102, represented by the output signal of the second upper bit latch unit 104, based on the output signal of the first upper bit latch unit 105 and the output signal of the memory unit 006 (the output signal of the lower bit latch unit 103 and the output signal of the second upper bit latch unit 104). Then, the correcting unit 013 outputs a corrected signal.

Figure 4:
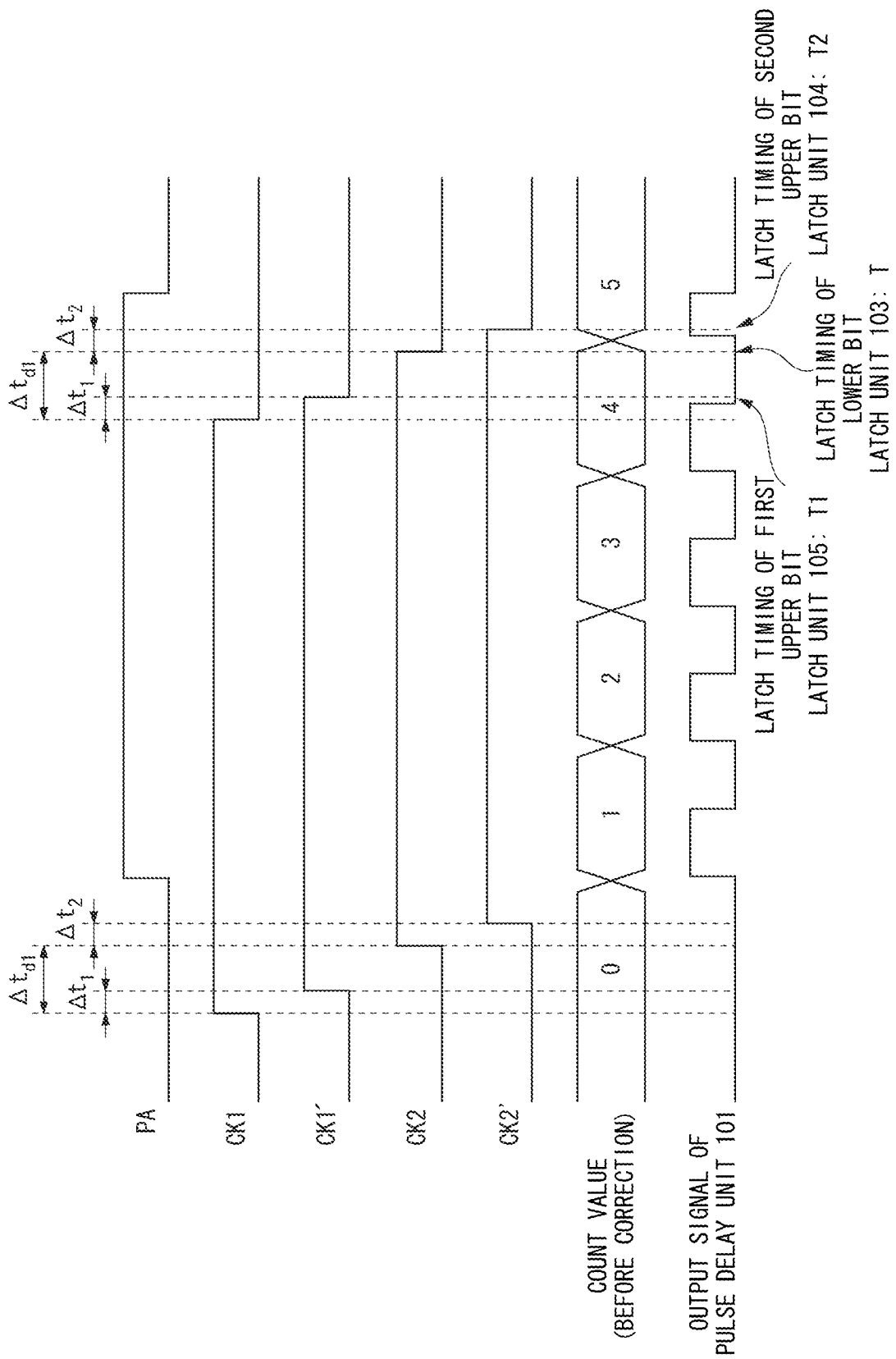
FIG. 4 is a timing chart illustrating an entire operation of the A/D converter arranged in the solid state image pickup device in accordance with the first preferred embodiment of the present invention.
Figure 5:
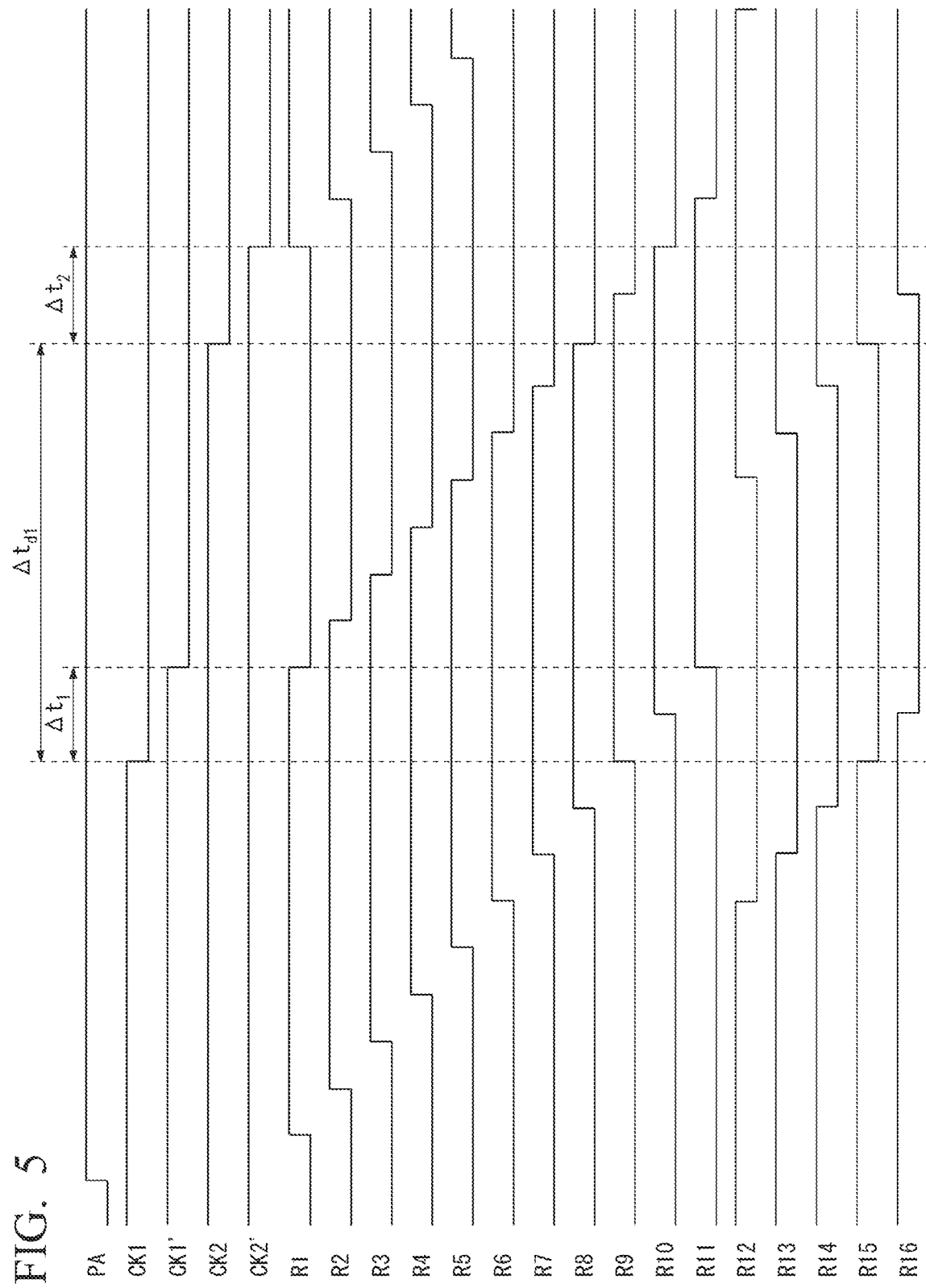
FIG. 5 is a timing chart illustrating an operation of the pulse delay unit in the A/D converter arranged in the solid state image pickup device in accordance with the first preferred embodiment of the present invention.

Next, an operation of the A/D converter 100 having the above described configuration will be described with reference to FIGS. 4 and 5. FIG. 4 is a timing chart illustrating an entire operation of the A/D converter 100 arranged in the solid state image pickup device in accordance with the first preferred embodiment of the present invention. FIG. 5 is a timing chart illustrating an operation of the pulse delay unit 101 in the A/D converter 100 arranged in the solid state image pickup device in accordance with the first preferred embodiment of the present invention.

First, the analog input signal Vin, which is to be subjected to A/D conversion, is input to the A/D converter 100, and as illustrated in FIG. 4, the signal CK1 transitions from a low level to a high level. After the time $\Delta t_1$, the signal CK1' transitions from a low level to a high level. Then, when the time $\Delta t_{d1}$ elapses from a point in time at which the signal CK1 transitions from a low level to a high level, the signal CK2 transitions from a low level to a high level. Then, when the time $\Delta t_2$ elapses from the point in time at which the signal CK2 transitions from a low level to a high level, the signal CK2' transitions from a low level to a high level. Thereafter, when the start pulse signal PA transitions from a low level to a high level, the pulse starts to circulate in the pulse delay unit 101. The counter unit 102 starts its count operation, and counts the pulse output from the pulse delay unit 101 while the signal CK2' remains in the high level.

The 2-input NAND circuits NAND1 and NAND2, the inverting circuits NOT1 and NOT2, and the delay units DE2 to DE11 and DE13 to DE16, which configure the pulse delay unit 101, delay the input pulse and output the delayed input pulse, respectively. The output signals R1 to R16 change as illustrated in FIG. 5. In the first preferred embodiment of the present invention, it is assumed that a delay time which the 2-input NAND circuit NAND1 and the inverting circuit NOT1 apply to the pulse input to the 2-input NAND circuit NAND1, a delay time which the inverting circuit NOT2 and the 2-input NAND circuit NAND2 apply to the pulse input to the inverting circuit NOT2, and a delay time which each of the delay units DE2 to DE11 and DE13 to DE16 applies to the pulse input to each of the delay units DE2 to DE11 and DE13 to DE16 are almost equal to one another. The inverting circuit NOT2 and the 2-input NAND circuit NAND2 are arranged between the delay unit DE11 and the delay unit DE13, and the output signal of the delay unit DE5 is input to one input terminal of the 2-input NAND circuit NAND2. By this configuration, the pulse whose status alternately changes between the high level and the low level continuously circulates inside the pulse delay unit 101.

As the start pulse signal PA transitions from the low level to the high level, the output signal of the pulse delay unit 101 transitions from the low level to the high level, so that the count value becomes 1. However, by calculating a difference between a reset voltage and a signal voltage of the solid state image pickup device through subsequent signal processing (not shown), one count is offset, and thus an accurate count value is obtained. Alternatively, since an actual count value is one count larger than an accurate count value, subsequent signal processing (not shown) of subtracting one from the count value may be performed. This can be similarly applied to preferred embodiments which will be described later.

When the sampling time period ends and the signal CK1 transitions from the high level to the low level, the signal CK1' transitions from the high level to the low level after the time $\Delta t_1$, and the first upper bit latch unit 105 stores the status of the least significant bit of the output signal of the counter unit 102. Then, when the time $\Delta t_{d1}$ elapses from the point in time at which the signal CK1 transitions from the high level to the low level, the signal CK2 transitions from the high level to the low level, and the lower bit latch unit 103 stores the output signals R1 to R16 of the pulse delay unit 101. Then, when the time $\Delta t_2$ elapses from the point in time at which the signal CK2 transitions from the high level to the low level, the signal CK2' transitions from the high level to the low level, the counter unit 102 stops the count operation, and the second upper bit latch unit 104 stores the count value.

As illustrated in FIG. 5, when the time $\Delta t_2$ elapses from the point in time at which the signal CK2 transitions from the high level to the low level, the output signal R1 of the inverting circuit NOT1 transitions from the low level to the high level. That is, an edge position of the pulse, inside the pulse delay unit 101, latched by the lower bit latch unit 103 is the position of the inverting circuit NOT1 (the delay element of the first stage in the pulse delay unit 101).

In the first preferred embodiment of the present invention, the position at which the pulse transitions from the low level to the high level is the pulse position inside the pulse delay unit 101. In FIG. 5, when neighboring output signals among the output signals R1 to R16 have different statuses, the output signal of the previous stage side has the high level, and the output signal of the subsequent stage side has the low level, the position of the previous stage side is the pulse position. In the case of the status illustrated in FIG. 5, when the time $\Delta t_2$ elapses from the point in time at which the signal CK2 transitions from the high level to the low level, the output signal R1 of the inverting circuit NOT1 (the delay element of the first stage) transitions to the high level, and the output signal R2 of the delay unit DE2 (the delay element of the second stage) remains in the low level. Thus, the pulse position is the delay element of the first stage.

After the counter unit 102 stops the count operation, the output signals of the second upper bit latch unit 104 and the lower bit latch unit 103 are sequentially output to the memory unit 006 and stored in the memory unit 006.

The correcting unit 013 compares the least significant bit of the output signal of the second upper bit latch unit 104 stored in the memory unit 006 with the output signal of the first upper bit latch unit 105, corrects the count value based on the comparison result and the signal of the lower bit latch unit 103 stored in the memory unit 006, and outputs the corrected output signal to the output unit 007. Among the output signals of the output unit 007, a signal corresponding to an output of the lower bit latch unit 103 is encoded into a value corresponding to the pulse detection position by an encoder unit (not shown), and then synthesized with the corrected count value.

Figure 6:
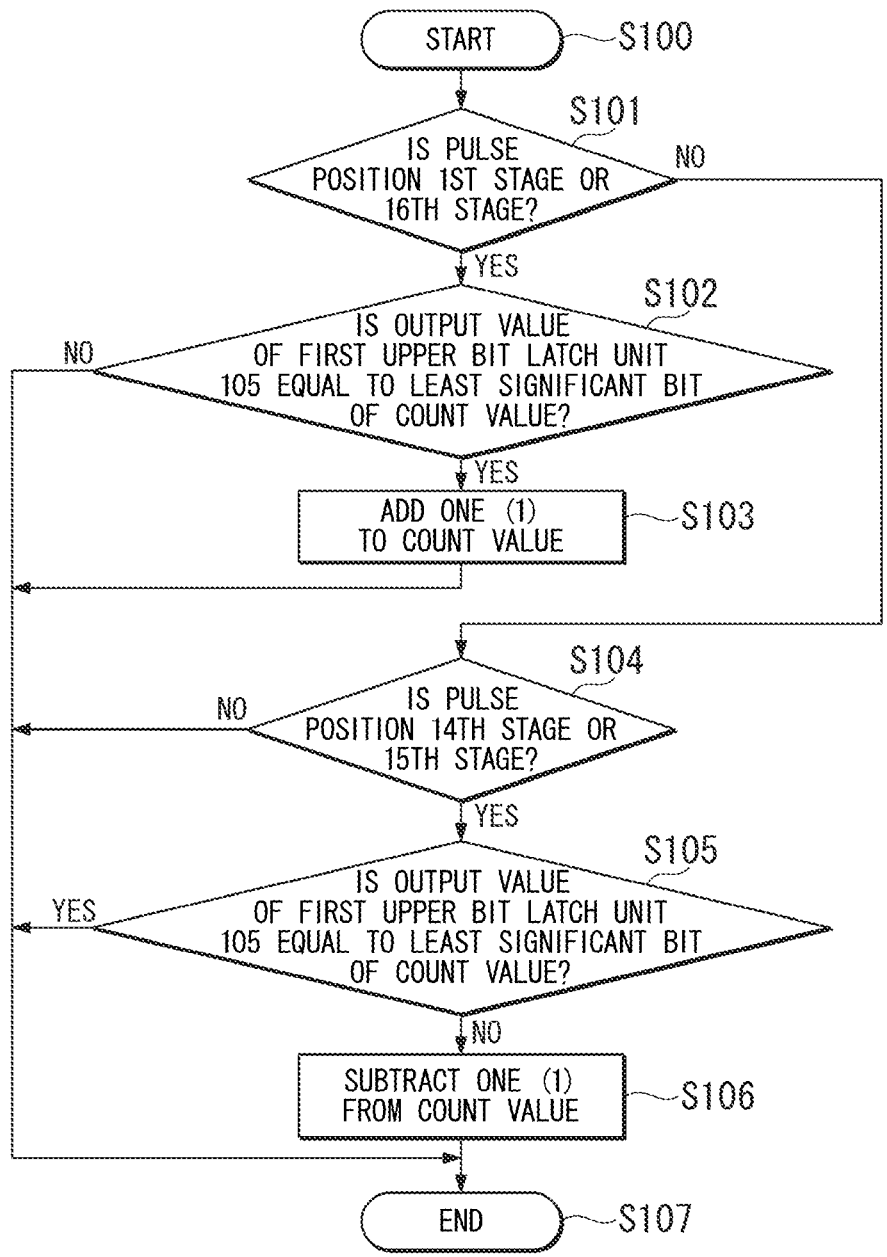
FIG. 6 is a flowchart illustrating an operation of a correcting unit arranged in the solid state image pickup device in accordance with the first preferred embodiment of the present invention.

Next, a correction process performed by the correcting unit 013 will be described with reference to FIG. 6. FIG. 6 is a flowchart illustrating an operation of the correcting unit arranged in the solid state image pickup device in accordance with the first preferred embodiment of the present invention. As described above, after the A/D conversion time period ends, and the output signal of the lower bit latch unit 103 and the output signal of the second upper bit latch unit 104 are stored in the memory unit 006, in step S100, the correcting unit 013 starts the correction process.

In step S101, the correcting unit 013 determines whether or not the pulse position in the pulse delay unit 101 is the delay element of the first stage or the sixteenth stage in the pulse delay unit 101, based on the output signal of the lower bit latch unit 103 stored in the memory unit 006. This determination corresponds to determination as to whether or not the count operation has stopped at a timing at which there is a possibility that an error will occur in the count value of the counter unit 102. When it is determined that the pulse position in the pulse delay unit 101 is the delay element of the first stage or the sixteenth stage in the pulse delay unit 101, in step S102, the correcting unit 013 compares the output value of the second upper bit latch unit 104 with the least significant bit of the count value stored in the memory unit 006, and determines whether or not the two values are equal to each other.

In the first preferred embodiment of the present invention, under the assumption that a timing at which the lower bit latch unit 103 latches the output signals R1 to R16 of the pulse delay unit 101 is a reference timing, the correcting unit 013 verifies whether or not the count value of the counter unit 102 is a value supposed as a count value at a reference timing, and corrects the count value.

As illustrated in FIG. 4, a timing at which the lower bit latch unit 013 latches the output signals R1 to R16 of the pulse delay unit 101 is defined as a reference timing T, a timing at which the first upper latch unit 105 latches the status of the least significant bit of the counter unit 102 is defined as a latch timing T1, and a timing at which the second upper bit latch unit 104 latches the count value of the counter unit 102 is defined as a latch timing T2.

When the pulse position in the pulse delay unit 101 is the delay element of the first stage or the sixteenth stage in the pulse delay unit 101, the count value of the counter unit 102 at the reference timing T is a value directly after the count operation is performed. The time $\Delta t_{d1}$ by which the stop signal delay unit 012 delays the signal CK1 is a time corresponding to half the period of the pulse output from the pulse delay unit 101 when the highest analog input signal Vin is input to the pulse delay unit 101. For this reason, the count value of the counter unit 102 at the latch timing T1 is a value before the count operation is performed (a value which is one smaller than the count value of the counter unit 102 at the reference timing T). Thus, the count value of the counter unit 102 at the reference timing T is different from the count value of the counter unit 102 at the latch timing T1.

In this regard, when the count value of the counter unit 102 at the latch timing T2 is different from the count value of the counter unit 102 at the latch timing T1, the count value of the counter unit 102 at the latch timing T2 can be regarded as the count value of the counter unit 102 at the reference timing T. However, when the count value of the counter unit 102 at the latch timing T2 is the same as the count value of the counter unit 102 at the latch timing T1, the count value of the counter unit 102 at the latch timing T2 is short one count and thus cannot be regarded as the count value of the counter unit 102 at the reference timing T. Thus, correction is necessary.

When it is determined in step S102 that the two values are equal to each other, in step S103, the correcting unit 013 adds one to the count value stored in the memory unit 006 and uses the resultant count value as the upper bit. Then, in step S107, the correction process is finished. However, when the two values are not equal to each other, the correcting unit 013 uses the count value stored in the memory unit 006 as the upper bit, and in step S107, the correction process is finished.

Meanwhile, when it is determined in step S101 that the pulse position in the pulse delay unit 101 is neither the delay element of the first stage nor that of the sixteenth stage in the pulse delay unit 101, in step S104, the correcting unit 013 determines whether or not the pulse position in the pulse delay unit 101 is the delay element of the fourteenth stage or the fifteenth stage in the pulse delay unit 101. This determination corresponds to determination as to whether or not the count operation has stopped at a timing at which there is a possibility that an error will occur in the count value of the counter unit 102, similarly to the determination of step S101. When it is determined that the pulse position in the pulse delay unit 101 is the delay element of the fourteenth stage or the fifteenth stage in the pulse delay unit 101, in step S105, the correcting unit 013 compares the output value of the second upper bit latch unit 104 with the least significant bit of the count value stored in the memory unit 006, and determines whether or not the two values are equal to each other.

When the pulse position in the pulse delay unit 101 is the delay element of the fourteenth stage or the fifteenth stage in the pulse delay unit 101, the count value of the counter unit 102 at the reference timing T is a value directly before the count operation is performed. Further, since the time $\Delta t_{d1}$ by which the stop signal delay unit 012 delays the signal CK1 is a time corresponding to half the period of the pulse, the count value of the counter unit 102 at the latch timing T1 is a value before the count operation is performed. Thus, the count value of the counter unit 102 at the reference timing T is the same as the count value of the counter unit 102 at the latch timing T1.

In this regard, when the count value of the counter unit 102 at the latch timing T2 is the same as the count value of the counter unit 102 at the latch timing T1, the count value of the counter unit 102 at the latch timing T2 can be regarded as the count value of the counter unit 102 at the reference timing T. However, when the count value of the counter unit 102 at the latch timing T2 is different from the count value of the counter unit 102 at the latch timing T1, the count value of the counter unit 102 at the latch timing T2 has a surplus of one count and thus cannot be regarded as the count value of the counter unit 102 at the reference timing T. Thus, correction is necessary.

When it is determined in step S105 that the two values are equal to each other, the correcting unit 013 uses the count value stored in the memory unit 006 as the upper bit, and in step S107, the correction process is finished. However, when the two values are not equal to each other, in step S106, the correcting unit 013 subtracts one from the count value stored in the memory unit 006 and uses the resultant count value as the upper bit. Then, in step S107, the correction process is finished. Meanwhile, when it is determined in step S104 that the pulse position in the pulse delay unit 101 is neither the delay element of the fourteenth stage nor that of the fifteenth stage in the pulse delay unit 101, the count value does not need to be corrected. Thus, the correcting unit 013 uses the count value stored in the memory unit 006 as the upper bit, and then in step S107, the correction process is finished.

In FIG. 4, the count values at the latch timing T1 and the reference timing T are 4, and the count value at the latch timing T2 is 5. In this case, in step S105, it is determined that the two values are not equal to each other, and in step S106, one is subtracted from the count value at the latch timing T2. The corrected count value can be regarded as the count value at the reference timing T.

Further, when the pulse position in the pulse delay unit 101 at the reference timing T is the delay element of the thirteenth stage in the pulse delay unit 101, in the above described operation, the count value is not corrected. For this reason, the pulse position in the pulse delay unit is required not to reach the delay element of the sixteenth stage in the pulse delay unit 101 at a point in time of the latch timing T2 delayed by $\Delta t_2$ from the reference timing T. Thus, $\Delta t_2$ needs to be smaller than a time at which the pulse passes through the delay elements of the two stages in the pulse delay unit 101 when the highest analog input signal Vin is input to the pulse delay unit 101.

As described above, according to the first preferred embodiment of the present invention, by comparing the output signal (one bit) of the first upper bit latch unit 105 with the least significant bit of the output signal of the second upper bit latch unit 104 and correcting the count value based on the comparison result and the pulse position in the pulse delay unit 101 (the output signal of the lower bit latch unit 103), it is possible to obtain the count value when the lower bit latch unit 103 latches the output signals R1 to R16 of the pulse delay unit 101, and thus A/D conversion can be performed with a high degree of accuracy. Further, since the number of bits of the first upper bit latch unit 105 can be reduced to be smaller than the number of bits of the counter unit 102, an increase in the size of the solid state image pickup device can be minimally-suppressed.

Figure 7:
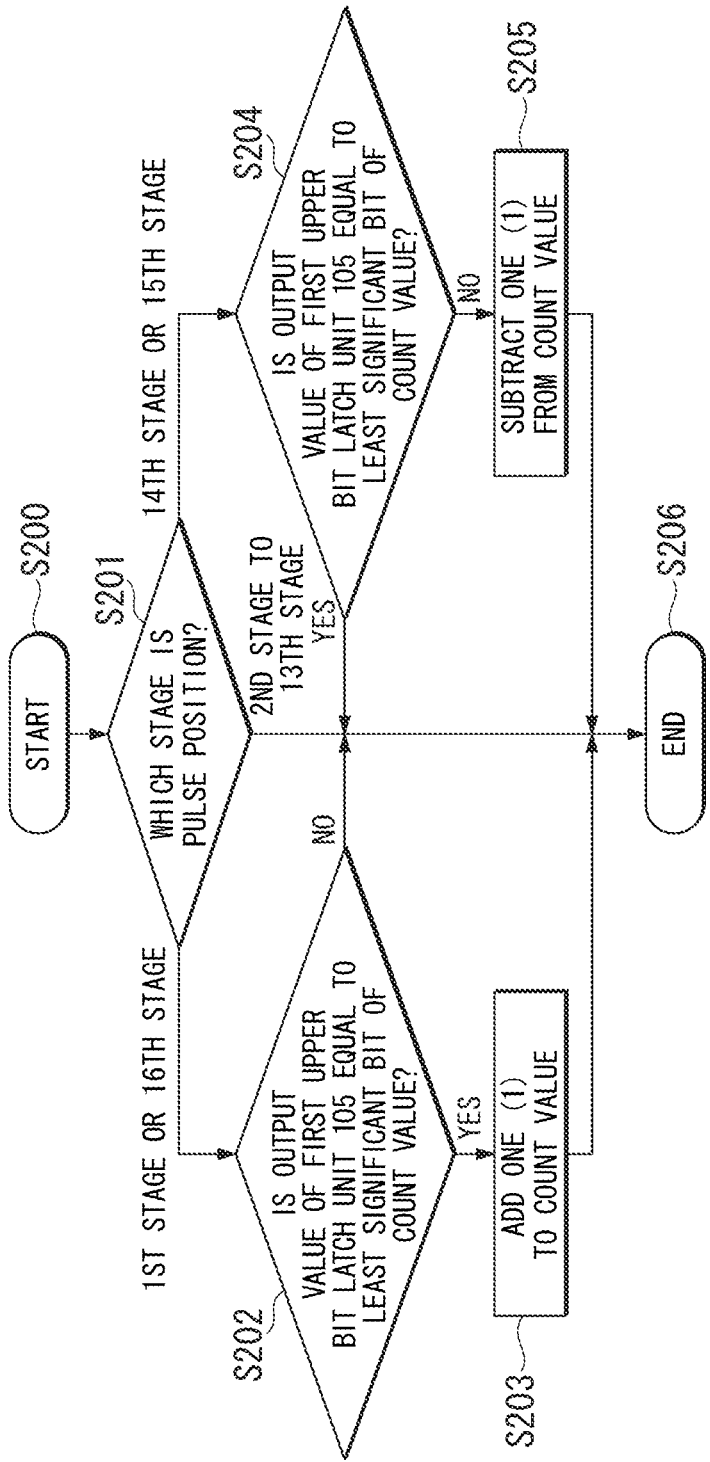
FIG. 7 is a flowchart illustrating an operation of the correcting unit arranged in the solid state image pickup device in accordance with the first preferred embodiment of the present invention.

The processing contents of the correcting unit 013 in accordance with the first preferred embodiment of the present invention are not limited to the process illustrated in FIG. 6. FIG. 7 is a flowchart illustrating an operation of the correcting unit arranged in the solid state image pickup device in accordance with the first preferred embodiment of the present invention. For example, as illustrated in FIG. 7, the stage number of the delay element which is the pulse position in the pulse delay unit 101 may be determined at one time (step S201). Then, the correction process (step S202 to S205) may be performed based on the determination result. It is desirable for a properly corrected resultant count value to become a upper bit. This can be similarly applied to preferred embodiments which will be described later.

Second Preferred Embodiment

Figure 8:
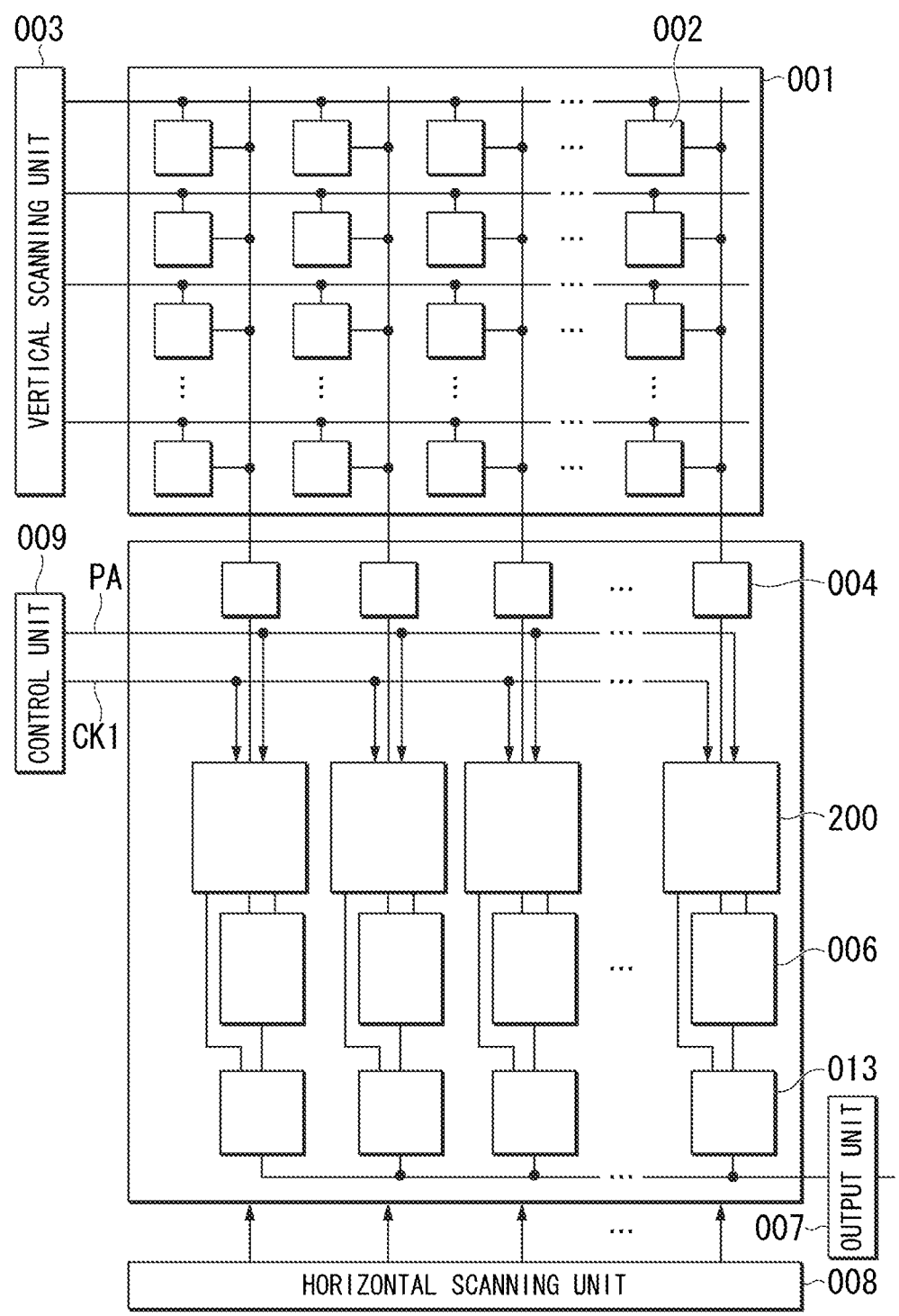
FIG. 8 is a block diagram illustrating a configuration of a solid state image pickup device in accordance with a second preferred embodiment of the present invention.
Figure 9:
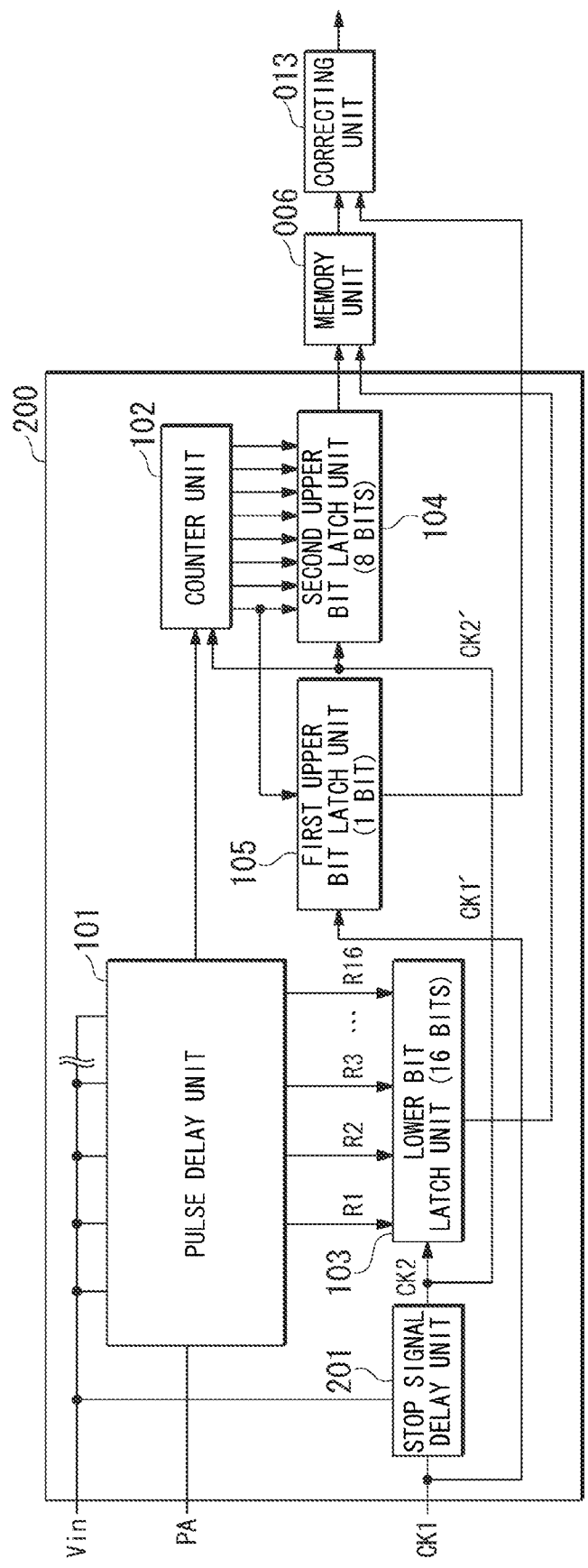
FIG. 9 is a block diagram illustrating a configuration of an A/D converter arranged in the solid state image pickup device in accordance with the second preferred embodiment of the present invention.

A second preferred embodiment of the present invention will be described. FIG. 8 is a block diagram illustrating a configuration of a solid state image pickup device in accordance with the second preferred embodiment of the present invention. FIG. 9 is a block diagram illustrating a configuration of an A/D converter 200 arranged in the solid state image pickup device in accordance with the second preferred embodiment of the present invention. Among components illustrated in FIGS. 8 and 9, the same components as in FIGS. 1 and 2 are denoted by the same reference numerals, and thus a redundant description will not be repeated here. Further, each configuration and operation in accordance with the second preferred embodiment of the present invention will be described below focusing on the differences with the first preferred embodiment.

The difference between the first preferred embodiment and the second preferred embodiment of the present invention lies in that the A/D converter 100 is replaced with the A/D converter 200, the stop signal delay unit 012 is replaced with a stop signal delay unit 201, the stop signal delay unit 201 is arranged in each A/D converter 200, and the analog input signal Vin is input to the stop signal delay unit 201.

Figure 10:
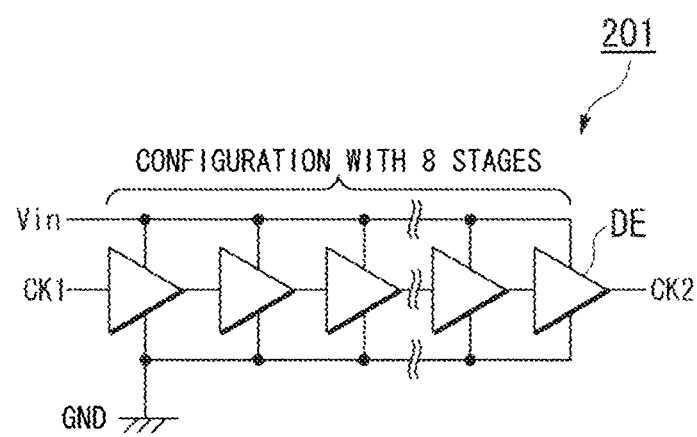
FIG. 10 is a circuit diagram illustrating a configuration of a stop signal delay unit arranged in the solid state image pickup device in accordance with the second preferred embodiment of the present invention.

FIG. 10 is a circuit diagram illustrating a configuration of the stop signal delay unit 201 arranged in the solid state image pickup device in accordance with the second preferred embodiment of the present invention. The stop signal delay unit 201 is configured by a circuit in which delay units DE, which are equivalent to the delay units DE2 to DE8 and DE10 to DE16 configuring the pulse delay unit 101, are connected to one another in series. One power supply terminal of the delay unit DE is connected to the analog input signal Vin, and another power supply terminal of the delay unit DE is connected to the GND. In the present preferred embodiment, the stop signal delay unit 201 is configured by 8 delay units DE (8 stages). That is, the stop signal delay unit 201 is configured by delay elements which have half as many stages as the delay elements arranged in the pulse delay unit 101.

The stop signal delay unit 201 is driven by the analog input signal Vin. Thus, when the analog input signal Vin changes and the period of the output signal of the pulse delay unit 101 changes, a delay time Δt of the stop signal delay unit 201 also changes in response to the change. For this reason, the signal CK2 always remains delayed from the signal CK1 by half the period of the output signal of the pulse delay unit 101.

Operations of the A/D converter 200 and the correcting unit 013 are the same as the operations of the A/D converter 100 and the correcting unit 013 in accordance with the first preferred embodiment, and thus a redundant description thereof will not be repeated here.

As described above, according to the second preferred embodiment of the present invention, since the stop signal delay unit 201 is driven by the analog input signal Vin, even when the period of the output signal of the pulse delay unit 101 significantly changes, an optimum delay time can be set, and A/D conversion can be performed with a high degree of accuracy in response to a wider change in the analog input signal Vin.

Third Preferred Embodiment

Figure 11:
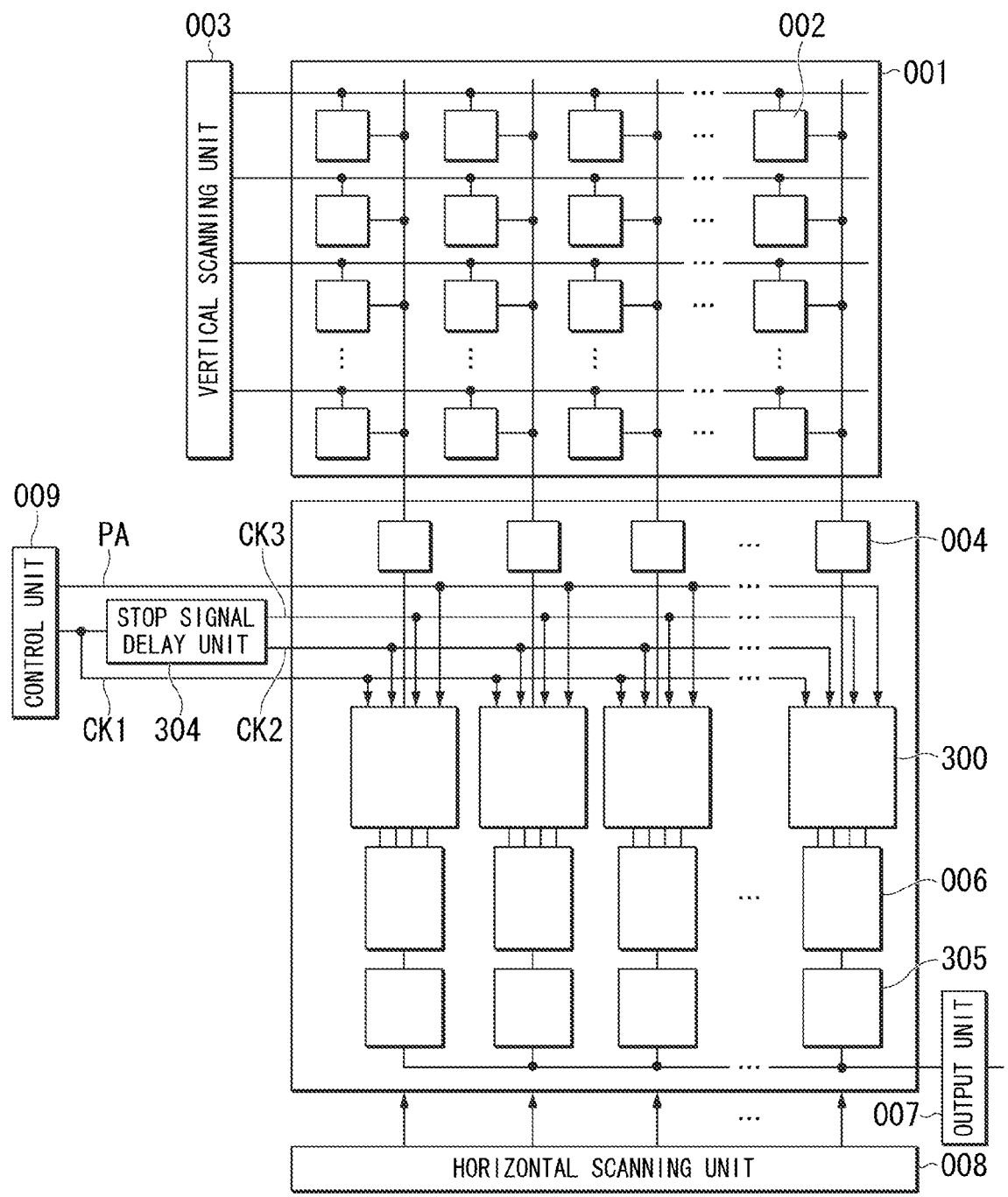
FIG. 11 is a block diagram illustrating a configuration of a solid state image pickup device in accordance with a third preferred embodiment of the present invention.
Figure 12:
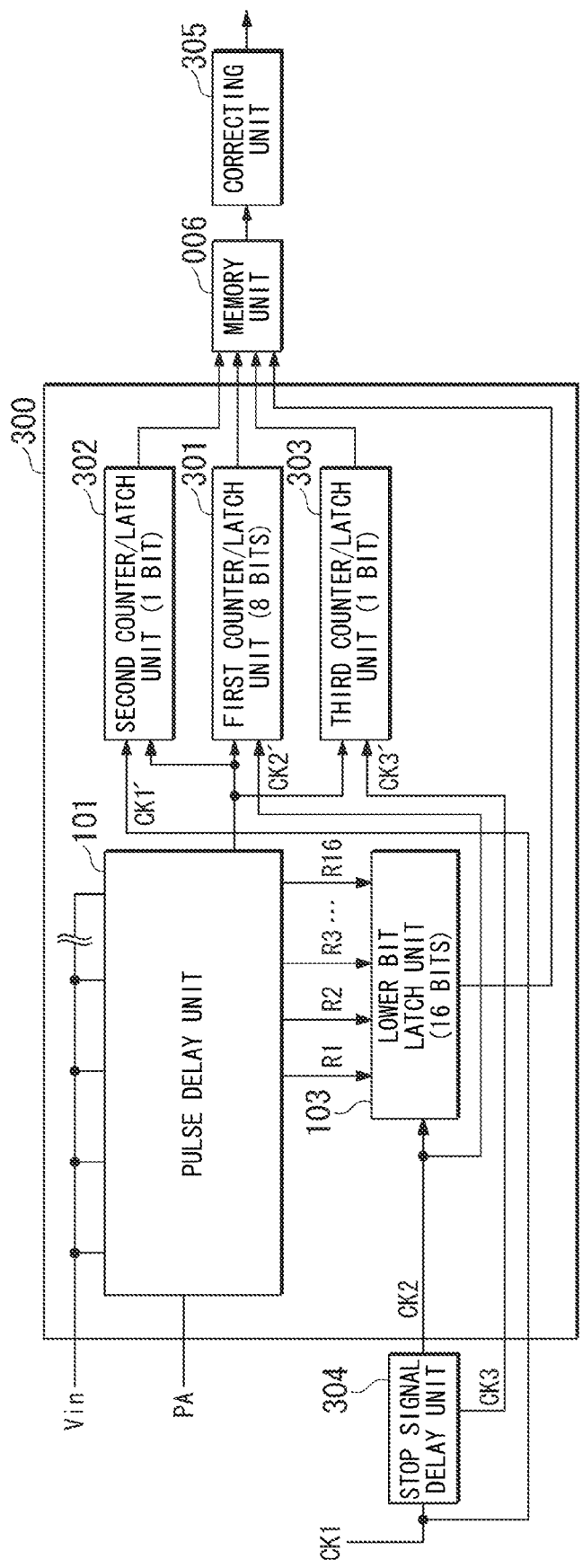
FIG. 12 is a block diagram illustrating a configuration of an A/D converter arranged in the solid state image pickup device in accordance with the third preferred embodiment of the present invention.

A third preferred embodiment of the present invention will be described. FIG. 11 is a block diagram illustrating a configuration of a solid state image pickup device in accordance with the third preferred embodiment of the present invention. FIG. 12 is a block diagram illustrating a configuration of an A/D converter 300 arranged in the solid state image pickup device in accordance with the third preferred embodiment of the present invention. Among components illustrated in FIGS. 11 and 12, the same components as in the solid state image pickup device and the A/D converter described above are denoted by the same reference numerals, and thus a redundant description thereof will not be repeated here. Further, each configuration and operation in accordance with the third preferred embodiment of the present invention will be described below focusing on differences thereof with the first preferred embodiment.

The difference between the first preferred embodiment and the third preferred embodiment of the present invention lies in that the A/D converter 100 is replaced with the A/D converter 300, the stop signal delay unit 012 is replaced with a stop signal delay unit 304, the correcting unit 013 is replaced with a correcting unit 305, and the counter unit 012, the first upper bit latch unit 105, and the second upper bit latch unit 104 are replaced with a first counter/latch unit 301, a second counter/latch unit 302, and a third counter/latch unit 303, respectively.

The stop signal delay unit 304 outputs the signal CK2 delayed from the signal CK1 by a predetermined time and a signal CK3 delayed from the signal CK2 by a predetermined time to the A/D converter 300 of each column. In the third preferred embodiment of the present invention, similarly to the first preferred embodiment, the predetermined time by which the stop signal delay unit 304 delays the signals CK1 and CK2 is set to a time corresponding to half the period of the pulse output from the pulse delay unit 101 when the highest analog input signal Vin is input to the pulse delay unit 101. In the following description, the time during which the stop signal delay unit 304 delays the signals CK1 and CK2 is represented as $\Delta t_{d2}$.

Phases of the signals CK1, CK2, and CK3 have the following relations. $\phi(CK1)$, $\phi(CK2)$, and $\phi(CK3)$ represent phases of the signals CK1, CK2, and CK3, respectively, and $\phi(\Delta t_{d2})$ represents a phase corresponding to the time $\Delta t_{d2}$.

$$\phi(CK2) = \phi(CK1) + \phi(\Delta td2)$$

$$\phi(CK3) = \phi(CK2) + \phi(\Delta td2) = \phi(CK1) + 2 \times \phi(\Delta td2)$$

The signal CK1, the signal CK2 delayed from the signal CK1 by the predetermined time, and the signal CK3 delayed from the signal CK2 by the predetermined time are delayed by $\Delta t_3$, $\Delta t_4$, and $\Delta t_5$, respectively, when reaching the first counter/latch unit 301, the first counter/latch unit 302, and the first counter/latch unit 303, due to the difference in the line length described above. A signal delayed from the signal CK1 by $\Delta t_3$ is defined as a signal CK1', a signal delayed from the signal CK2 by $\Delta t_4$ is defined as a signal CK2', and a signal delayed from the signal CK3 by $\Delta t_5$ is defined as a signal CK3'.

The first counter/latch circuit 301 is configured by an 8-bit circuit having a count function and a latch function. An output signal R16 of a delay unit DE16 of a last stage of the pulse delay unit 101 and the signal CK2' are input to the first counter/latch unit 301. The first counter/latch unit 301 counts and latches the output signal R16 of the pulse delay unit 101, and outputs the count result to a memory unit 006 in synchronization with the period of the signal CK2'.

The second counter/latch circuit 302 is configured by a 1-bit circuit having a count function and a latch function. The output signal R16 of the delay unit DE16 of the last stage of the pulse delay unit 101 and the signal CK1' are input to the second counter/latch unit 302. The second counter/latch unit 302 counts and latches the output signal R16 of the pulse delay unit 101, and outputs the count result to the memory unit 006 in synchronization with the period of the signal CK1'.

The third counter/latch circuit 303 is configured by a 1-bit circuit having a count function and a latch function. The output signal R16 of the delay unit DE16 of the last stage of the pulse delay unit 101 and the signal CK3' are input to the third counter/latch unit 303. The third counter/latch unit 303 counts and latches the output signal R16 of the pulse delay unit 101, and outputs the count result to the memory unit 006 in synchronization with the period of the signal CK3'.

An output signal of the memory unit 006 is input to the correcting unit 305. The correcting unit 305 corrects the count value which is the output signal of the first counter/latch circuit 301 based on the input signal, and outputs a signal based on the corrected count value.

Figure 13:
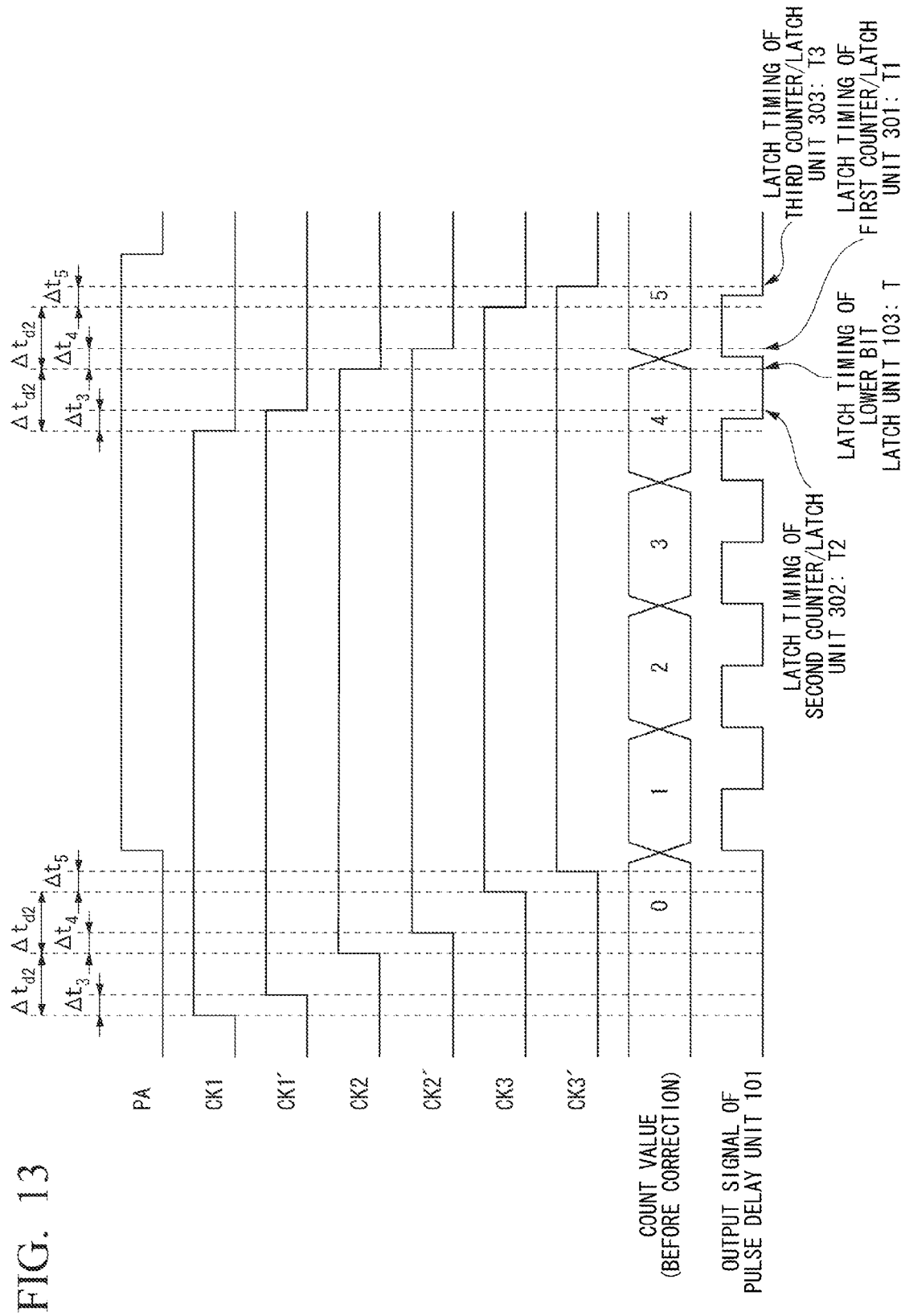
FIG. 13 is a timing chart illustrating an operation of the A/D converter arranged in the solid state image pickup device in accordance with the third preferred embodiment of the present invention.

An operation of the A/D converter 300 having the above configuration will be described with reference to FIG. 13. FIG. 13 is a timing chart illustrating an operation of the A/D converter 300 arranged in the solid state image pickup device in accordance with the third preferred embodiment of the present invention. First, the analog input signal Vin, which is to be subjected to A/D conversion, is input to the A/D converter 300, and the signal CK1 transitions from a low level to a high level. After the time $\Delta t_3$, the signal CK1' transitions from a low level to a high level. Then, when the time $\Delta t_{d2}$ elapses from a point in time at which the signal CK1 transitions from a low level to a high level, the signal CK2 transitions from a low level to a high level. Then, when the time $\Delta t_{d2}$ elapses from a point in time at which the signal CK2 transitions from a low level to a high level, the signal CK3 transitions from a low level to a high level. Then, when the time $\Delta t_5$ elapses from the point in time at which the signal CK3 transitions from a low level to a high level, the signal CK3' transitions from a low level to a high level. Thereafter, when the start pulse signal PA transitions from a low level to a high level, the pulse starts to circulate in the pulse delay unit 101. The first to third counter/latch units 301 to 303 start a count operation, and count the pulse output from the pulse delay unit 101 while the signals CK1' to CK3' remain at the high level.

When the sampling time period ends and the signal CK1 transitions from the high level to the low level, the signal CK1' transitions from the high level to the low level after the time $\Delta t_3$, and the second counter/latch unit 302 stops the count operation and stores the count value. Then, when the time $\Delta t_{d2}$ elapses from the point in time at which the signal CK1 transitions from the high level to the low level, the signal CK2 transitions from the high level to the low level, and the lower bit latch unit 103 stores the output signals R1 to R16 of the pulse delay unit 101. Then, when the time $\Delta t_4$ elapses from the point in time at which the signal CK2 transitions from the high level to the low level, the signal CK2' transitions from the high level to the low level, and the first counter/latch unit 301 stops the count operation and stores the count value.

Then, when the time $\Delta t_{d2}$ elapses from the point in time at which the signal CK2 transitions from the high level to the low level, the signal CK3 transitions from the high level to the low level. Then, when the time $\Delta t_5$ elapses from the point in time at which the signal CK3 transitions from the high level to the low level, the signal CK3' transitions from the high level to the low level, the third counter/latch unit 303 stops the count operation and stores the count value. Thereafter, the output signals of the first to third counter/latch units 301 to 303 and the output signal of the lower bit latch unit 103 are sequentially output to the memory unit 006 and stored in the memory unit 006.

The correcting unit 305 compares the output signal of the first counter/latch unit 301 stored in the memory unit 006 with either the output signal of the second counter/latch unit 302 or the output signal of the third counter/latch unit 303, corrects the count value based on the comparison result and the signal of the lower bit latch unit 103 stored in the memory unit 006, and outputs the corrected output signal to the output unit 007. Among the output signals of the output unit 007, a signal corresponding to an output of the lower bit latch unit 103 is encoded into a value corresponding to the pulse detection position by an encoder unit (not shown), and then synthesized with the corrected count value.

Figure 14:
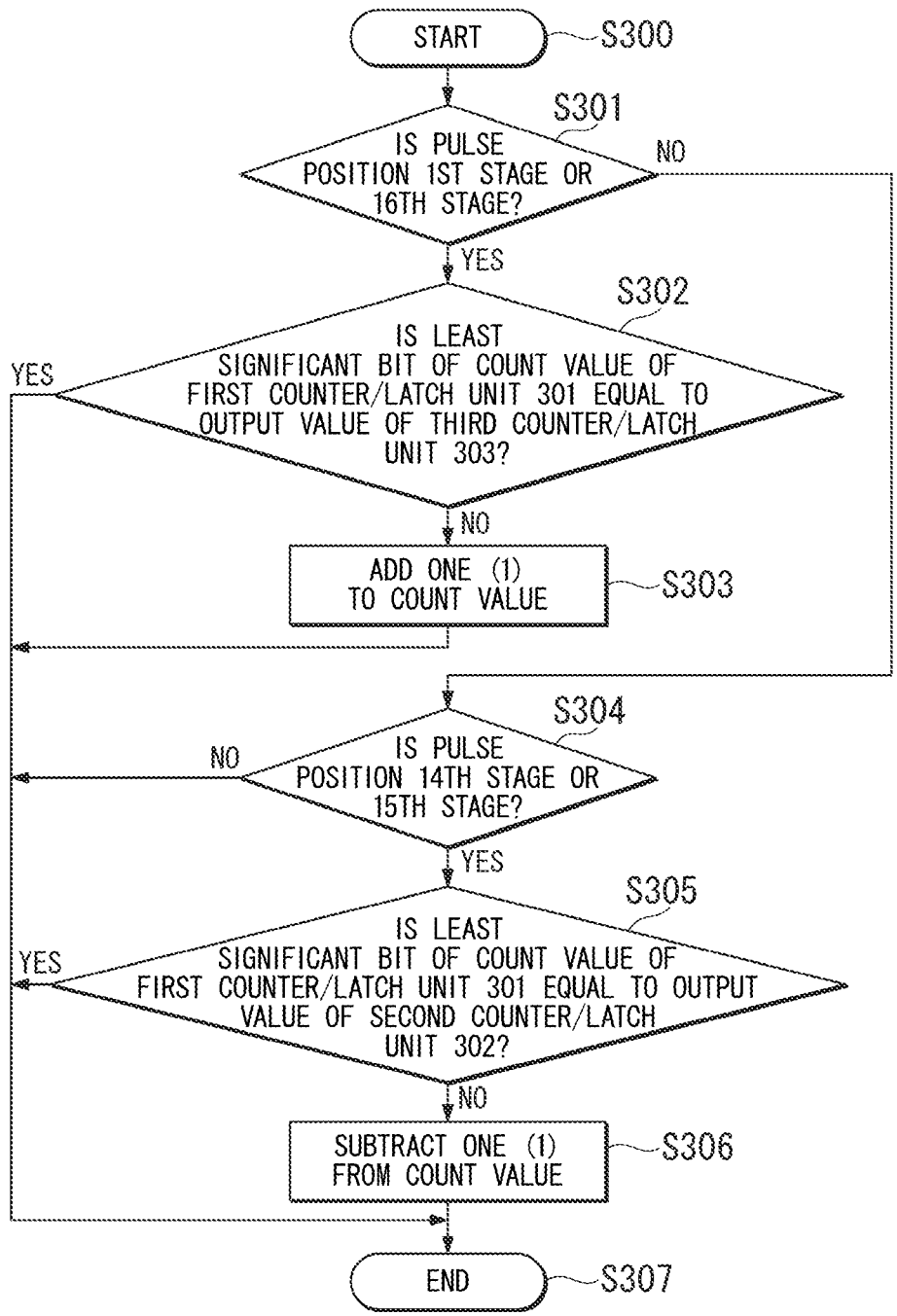
FIG. 14 is a flowchart illustrating an operation of the correcting unit arranged in the solid state image pickup device in accordance with the third preferred embodiment of the present invention.

Next, a correction process performed by the correcting unit 305 will be described with reference to FIG. 14. FIG. 14 is a flowchart illustrating an operation of the correcting unit arranged in the solid state image pickup device in accordance with the third preferred embodiment of the present invention. After the A/D conversion time period ends as described above and the output signal of the lower bit latch unit 103 and the output signals of the first to third counter/latch units 301 to 303 are stored in the memory unit 006, in step S300, the correcting unit 305 starts the correction process.

In step S301, the correcting unit 305 determines whether or not the pulse position in the pulse delay unit 101 is the delay element of the first stage or the sixteenth stage in the pulse delay unit 101, based on the output signal of the lower bit latch unit 103 stored in the memory unit 006. This determination corresponds to determination as to whether or not the count operation has stopped at a timing at which there is a possibility that an error will occur in the count value of the first counter/latch unit 301. When it is determined that the pulse position in the pulse delay unit 101 is the delay element of the first stage or the sixteenth stage in the pulse delay unit 101, in step S302, the correcting unit 305 compares the least significant bit of the count value of the first counter/latch unit 301 stored in the memory unit 006 with the output value of the third counter/latch unit 303, and determines whether or not the two values are equal to each other.

In the third preferred embodiment of the present invention, similarly to the first preferred embodiment, under the assumption that a timing at which the lower bit latch unit 103 latches the output signals R1 to R16 of the pulse delay unit 101 is a reference timing, the correcting unit 305 verifies whether or not the count value of the first counter/latch unit 301 is a value assumed to be a count value at a reference timing, and corrects the count value.

As illustrated in FIG. 13, a timing at which the lower bit latch unit 103 latches the output signals R1 to R16 of the pulse delay unit 101 is defined as a reference timing T1, a timing at which the first counter/latch unit 301 latches the count value is defined as a latch timing T1, a timing at which the second counter/latch unit 302 latches the count value is defined as a latch timing T2, and a timing at which the third counter/latch unit 303 latches the count value is defined as a latch timing T3.

When the pulse position in the pulse delay unit 101 is the delay element of the first stage or the sixteenth stage in the pulse delay unit 101, the count value of the first counter/latch unit 301 at the reference timing T is a value directly after the count operation is performed. The time $\Delta t_{d2}$ by which the stop signal delay unit 304 delays the signal CK2 is a time corresponding to half the period of the pulse output from the pulse delay unit 101 when the highest analog input signal Vin is input to the pulse delay unit 101. For this reason, the count value of the third counter/latch unit 303 at the latch timing T3 is a value after the count operation is performed. Thus, the least significant bit of the count value of the first counter/latch unit 301 at the reference timing T is the same as the count value of the third counter/latch unit 303 at the latch timing T3.

In this regard, when the least significant bit of the count value of the first counter/latch unit 301 at the latch timing T1 is the same as the count value of the third counter/latch unit 303 at the latch timing T3, the count value of the first counter/latch unit 301 at the latch timing T1 can be regarded as the count value of the first counter/latch unit 301 at the reference timing T. However, when the least significant bit of the count value of the first counter/latch unit 301 at the latch timing T1 is different from the count value of the third counter/latch unit 303 at the latch timing T3, the count value of the first counter/latch unit 301 at the latch timing T1 is short one count and thus cannot be regarded as the count value of the first counter/latch unit 301 at the reference timing T. Thus, correction is necessary.

When it is determined in step S302 that the two values are not equal to each other, in step S303, the correcting unit 305 adds one to the count value of the first counter/latch unit 301 stored in the memory unit 006 and uses the resultant count value as the upper bit. Then, in step S307, the correction process is finished. However, when the two values are equal to each other, the correcting unit 305 uses the count value of the first counter/latch unit 301 stored in the memory unit 006 as the upper bit, and in step S307, the correction process is finished.

Meanwhile, when it is determined in step S301 that the pulse position in the pulse delay unit 101 is neither the delay element of the first stage nor that of the sixteenth stage in the pulse delay unit 101, in step S304, the correcting unit 305 determines whether or not the pulse position in the pulse delay unit 101 is the delay element of the fourteenth stage or the fifteenth stage in the pulse delay unit 101. This determination corresponds to determination as to whether or not the count operation has stopped at a timing at which there is a possibility that an error will occur in the count value of the first counter/latch unit 301, similarly to the determination of step S301. When it is determined that the pulse position in the pulse delay unit 101 is the delay element of the fourteenth stage or the fifteenth stage in the pulse delay unit 101, in step S305, the correcting unit 305 compares the least significant bit of the count value of the first counter/latch unit 301 stored in the memory unit 006 with the count value of the second counter/latch unit 302, and determines whether or not the two values are equal to each other.

When the pulse position in the pulse delay unit 101 is the delay element of the fourteenth stage or the fifteenth stage in the pulse delay unit 101, the count value of the first counter/latch unit 301 at the reference timing T is a value directly before the count operation is performed. Further, since the time $\Delta t_{d2}$ by which the stop signal delay unit 304 delays the signal CK1 is a time corresponding to half the period of the pulse, the count value of the second counter/latch unit 302 at the latch timing T2 is a value before the count operation is performed. Thus, the least significant bit of the count value of the first counter/latch unit 301 at the reference timing T is the same as the count value of the second counter/latch unit 302 at the latch timing T2.

In this regard, when the least significant bit of the count value of the first counter/latch unit 301 at the latch timing T1 is the same as the count value of the second counter/latch unit 302 at the latch timing T2, the count value of the first counter/latch unit 301 at the latch timing T1 can be regarded as the count value of the first counter/latch unit 301 at the reference timing T. However, when the least significant bit of the count value of the first counter/latch unit 301 at the latch timing T1 is different from the count value of the second counter/latch unit 302 at the latch timing T2, the count value of the first counter/latch unit 301 at the latch timing T1 has a surplus of one count and thus cannot be regarded as the count value of the first counter/latch unit 301 at the reference timing T. Thus, correction is necessary.

When it is determined in step S305 that the two values are equal to each other, the correcting unit 305 uses the count value of the first counter/latch unit 301 stored in the memory unit 006 as the upper bit, and in step S307, the correction process is finished. However, when the two values are not equal to each other, in step S306, the correcting unit 305 subtracts one from the count value of the first counter/latch unit 301 stored in the memory unit 006 and uses the resultant count value as the upper bit. Then, in step S307, the correction process is finished. Meanwhile, when it is determined in step S304 that the pulse position in the pulse delay unit 101 is neither the delay element of the fourteenth stage nor that of the fifteenth stage in the pulse delay unit 101, the count value need not be corrected. Thus, the correcting unit 013 uses the count value of the first counter/latch unit 301 stored in the memory unit 006 as the upper bit, and then in step S307, the correction process is finished.

In FIG. 13, the count values at the latch timing T2 and the reference timing T are 4, and the count values at the latch timings T1 and T3 are 5. In this case, in step S305, it is determined that the two values are not equal to each other, and in step S306, one is subtracted from the count value at the latch timing T1. The corrected count value can be regarded as the count value at the reference timing T.

Further, when the pulse position in the pulse delay unit 101 at the reference timing T is the delay element of the thirteenth stage in the pulse delay unit 101, in the above described operation, the count value is not corrected. For this reason, the pulse position in the pulse delay unit is required to not reach the delay element of the sixteenth stage in the pulse delay unit 101 at a point in time of the latch timing T1 delayed by $\Delta t_4$ from the reference timing T. Thus, it needs to be $\Delta t_4$ smaller than a time at which the pulse passes through the delay elements of the two stages in the pulse delay unit 101 when the highest analog input signal Vin is input to the pulse delay unit 101.

As described above, according to the third preferred embodiment of the present invention, by comparing the least significant bit of the count value of the first counter/latch unit 301 with either the counter value of the second counter/latch unit 302 or the counter value of the third counter/latch unit 303 and correcting the count value based on the comparison result and the pulse position in the pulse delay unit 101 (the output signal of the lower bit latch unit 103), it is possible to obtain the count value when the lower bit latch unit 103 latches the output signals R1 to R16 of the pulse delay unit 101, and thus A/D conversion can be performed with a high degree of accuracy. Further, since the number of bits of the second counter/latch unit 302 and the number of bits of the third counter/latch unit 303 can be reduced to be smaller than the number of bits of the first counter/latch unit 301, an increase in the size of the solid state image pickup device can be minimally-suppressed.

Fourth Preferred Embodiment

Figure 15:
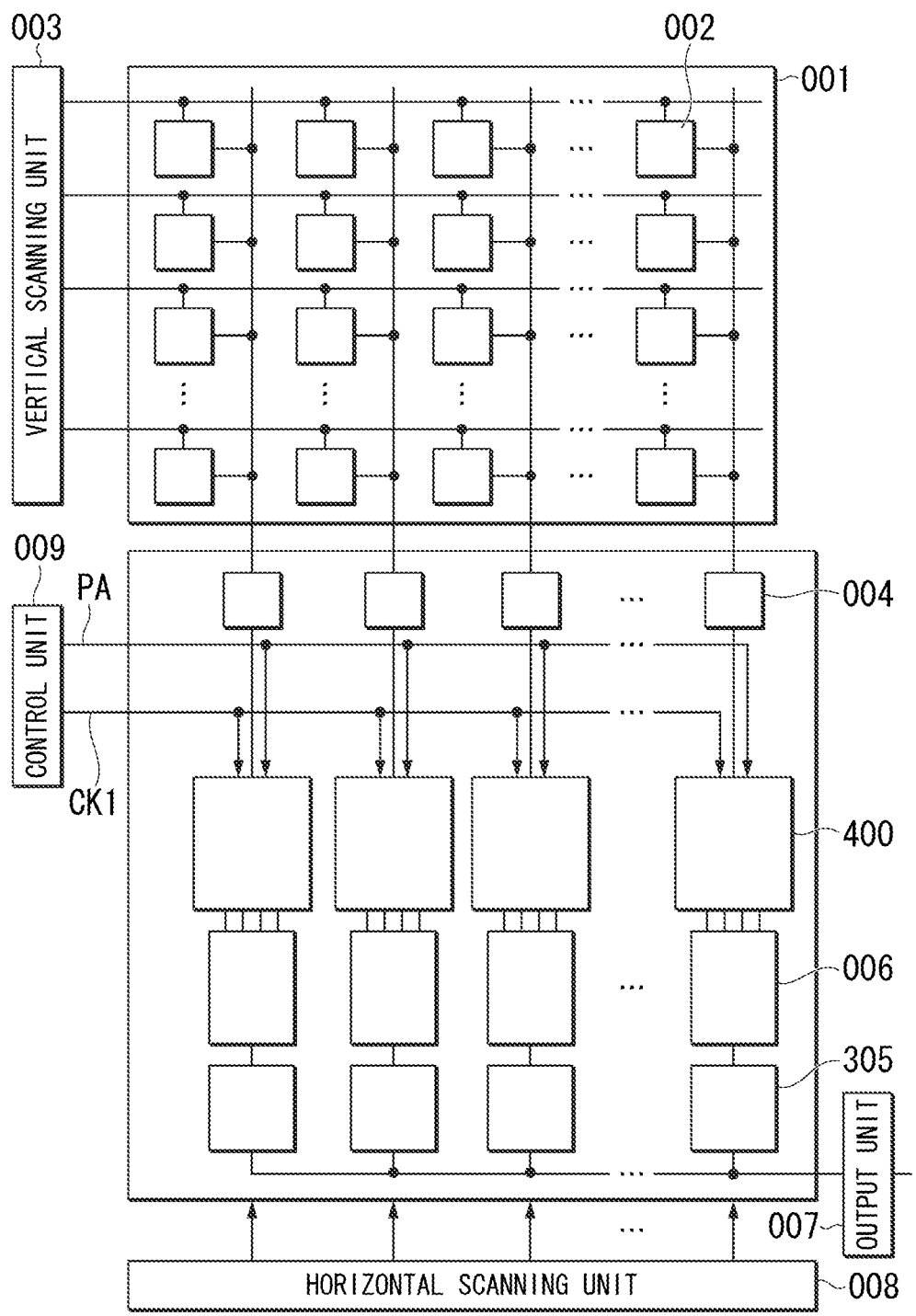
FIG. 15 is a block diagram illustrating a configuration of a solid state image pickup device in accordance with a fourth preferred embodiment of the present invention.
Figure 16:
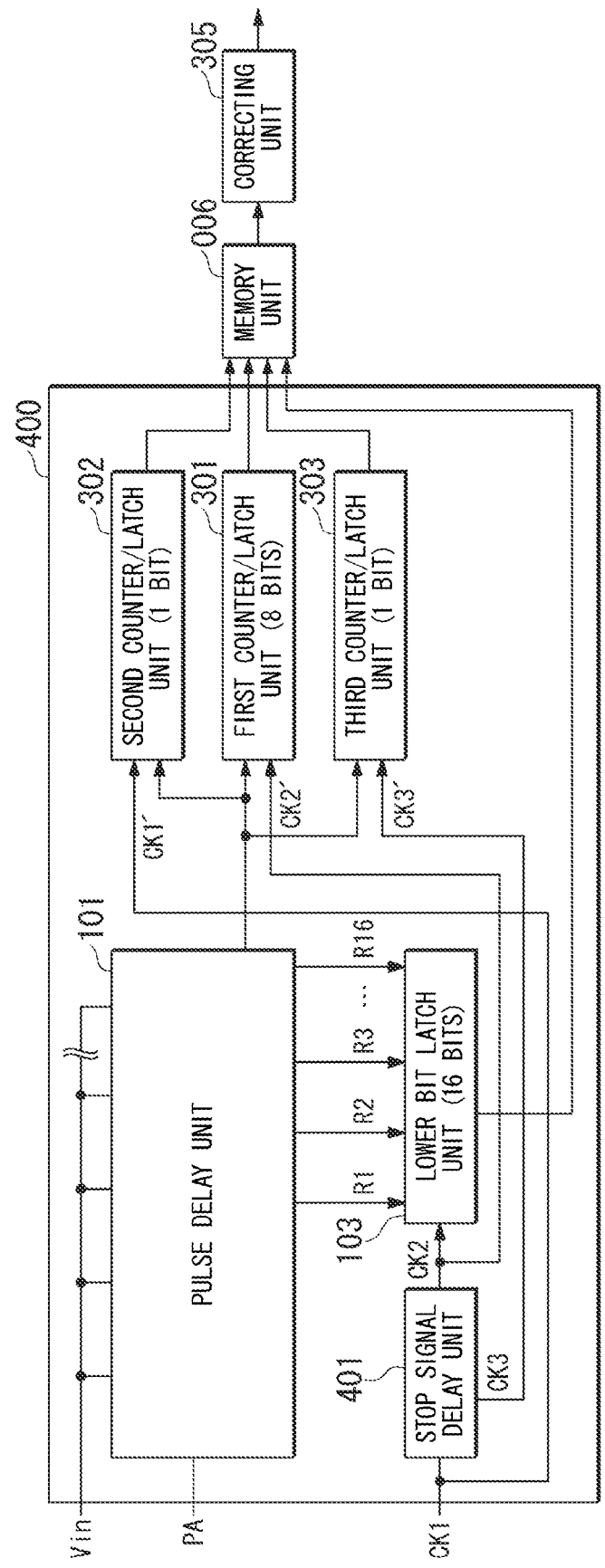
FIG. 16 is a block diagram illustrating a configuration of an A/D converter arranged in the solid state image pickup device in accordance with the fourth preferred embodiment of the present invention.

A fourth preferred embodiment of the present invention will be described. FIG. 15 is a block diagram illustrating a configuration of a solid state image pickup device in accordance with the fourth preferred embodiment of the present invention. FIG. 16 is a block diagram illustrating a configuration of an A/D converter 400 arranged in the solid state image pickup device in accordance with the fourth preferred embodiment of the present invention. Among components illustrated in FIGS. 15 and 16, the same components as in the solid state image pickup device and the A/D converter described above are denoted by the same reference numerals, and thus the redundant description will not be repeated here. Further, each configuration and operation in accordance with the fourth preferred embodiment of the present invention will be described below focusing on the differences with the third preferred embodiment.

A relation between the third preferred embodiment and the fourth preferred embodiment of the present invention corresponds to a relation between the first preferred embodiment and the second preferred embodiment of the present invention. The difference between the third preferred embodiment and the fourth preferred embodiment of the present invention lies in that the A/D converter 300 is replaced with an A/D converter 400, the stop signal delay unit 304 is replaced with a stop signal delay unit 401, the stop signal delay unit 401 is arranged in each A/D converter 400, and the analog input signal Vin is input to the stop signal delay unit 401.

The stop signal delay unit 401 is configured by the delay units DE, similarly to the stop signal delay unit 201 in accordance with the second preferred embodiment. However, the stop signal delay unit 401 in accordance with the fourth preferred embodiment of the present invention is configured by 16 delay units (16 stages). A signal CK2 output from the stop signal delay unit 401 is an output signal of a delay unit DE of an eighth stage, and a signal CK3 output from the stop signal delay unit 401 is an output signal of a delay unit DE of a sixteenth stage. That is, the signal CK2 constantly remains delayed from the signal CK1 by half the period of the output signal of the pulse delay unit 101, and the signal CK3 constantly remains delayed from the signal CK1 by one period of the output signal of the pulse delay unit 101.

Operations of the A/D converter 400 and the correcting unit 305 are the same as in the A/D converter 300 and the correcting unit 305 in accordance with the third preferred embodiment, and thus a redundant description will not be repeated here.

As described above, according to the fourth preferred embodiment of the present invention, since the stop signal delay unit 401 is driven by the analog input signal Vin, even when the period of the output signal of the pulse delay unit 101 significantly changes, an optimum delay time can be set, and A/D conversion can be performed with a high degree of accuracy in response to a wider change in the analog input signal Vin.

Fifth Preferred Embodiment

Figure 17:
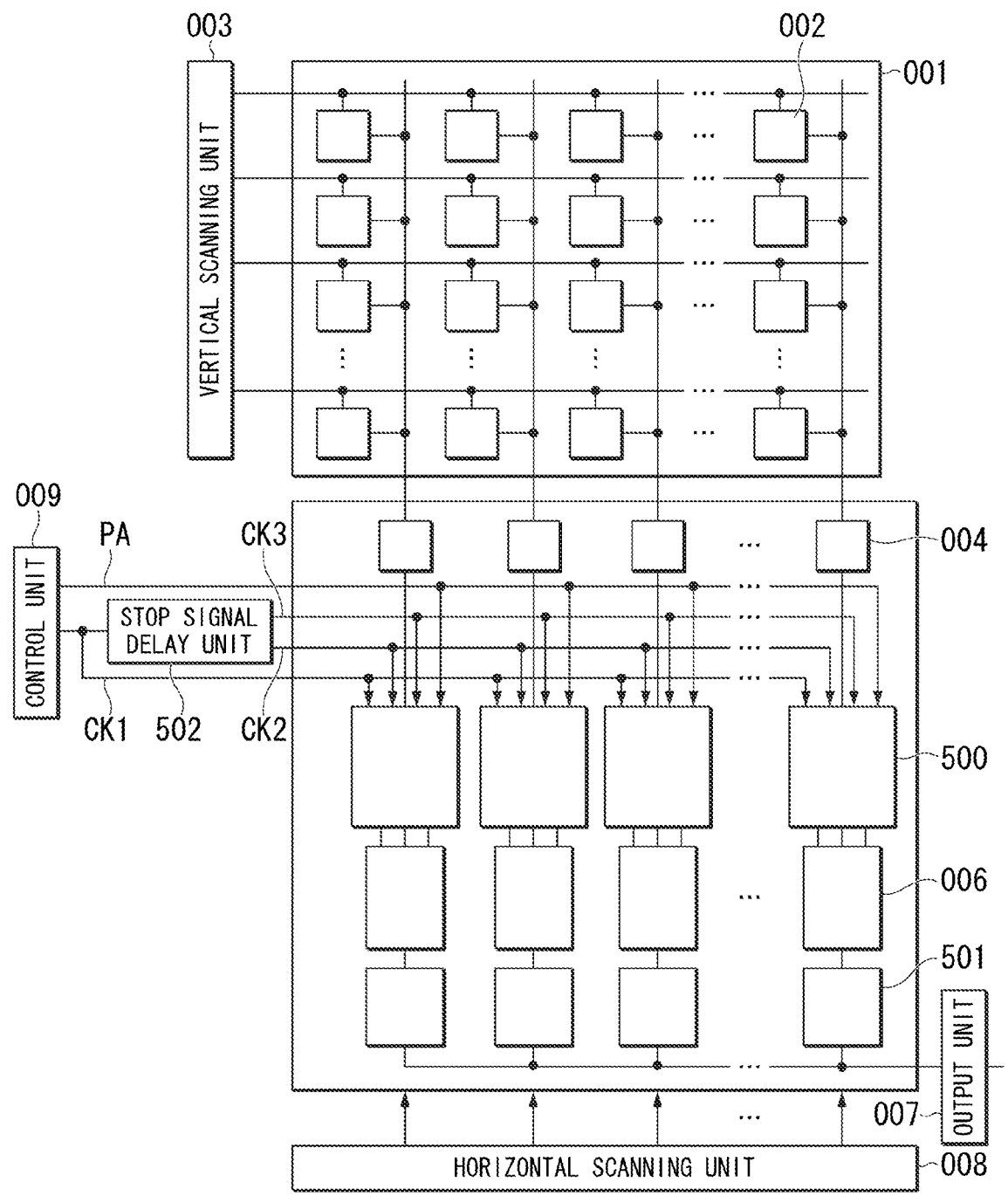
FIG. 17 is a block diagram illustrating a configuration of a solid state image pickup device in accordance with a fifth preferred embodiment of the present invention.
Figure 18:
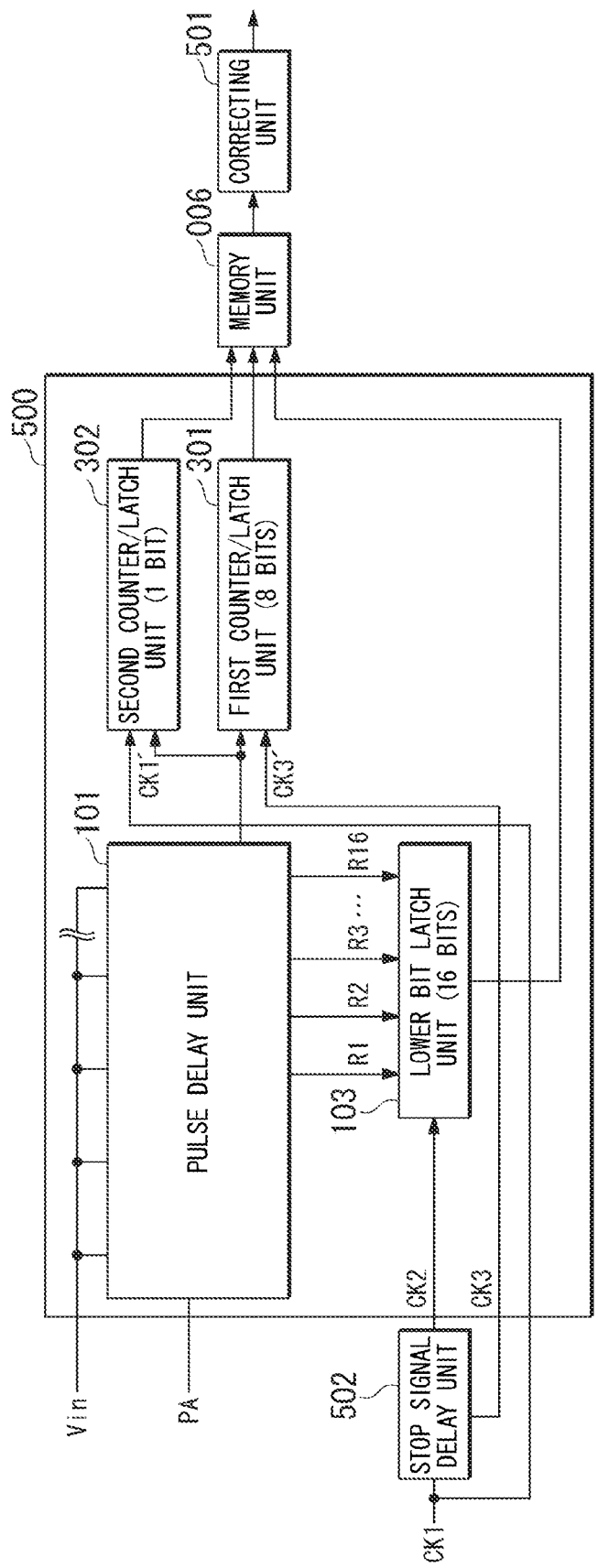
FIG. 18 is a block diagram illustrating a configuration of an A/D converter arranged in the solid state image pickup device in accordance with the fifth preferred embodiment of the present invention.

A fifth preferred embodiment of the present invention will be described. FIG. 17 is a block diagram illustrating a configuration of a solid state image pickup device in accordance with the fifth preferred embodiment of the present invention. FIG. 18 is a block diagram illustrating a configuration of an A/D converter 500 arranged in the solid state image pickup device in accordance with the fifth preferred embodiment of the present invention. Among components illustrated in FIGS. 17 and 18, the same components as in the solid state image pickup device and the A/D converter described above are denoted by the same reference numerals, and thus the redundant description will not be repeated. Further, each configuration and operation in accordance with the fifth preferred embodiment of the present invention will be described below focusing on the differences with the third preferred embodiment.

The difference between the third preferred embodiment and the fifth preferred embodiment of the present invention lies in that the A/D converter 300 is replaced with the A/D converter 500, the correcting unit 305 is replaced with a correcting unit 501, the stop signal delay unit 304 is replaced with a stop signal delay unit 502, and the third counter/latch unit 303 is removed. The signal CK3 is input to the first counter/latch unit 301. The first counter/latch unit 301 outputs the count result to the memory unit 006 in synchronization with the period of the signal CK3' delayed from the signal CK3.

In the fifth preferred embodiment of the present invention, a predetermined time by which the stop signal delay unit 502 delays the signals CK1 and CK2 is set to a time corresponding to a quarter (¼) of the period of the pulse output from the pulse delay unit 101 when the highest analog input signal Vin is input to the pulse delay unit 101. In the following description, the time during which the stop signal delay unit 502 delays the signals CK1 and CK2 is represented as $\Delta t_{d3}$.

An output signal of the memory unit 006 is input to the correcting unit 501. The correcting unit 501 corrects the count value which is the output signal of the first counter/latch circuit 301 based on the input signal, and outputs a signal based on the corrected count value.

An operation of the A/D converter 500 in accordance with the fifth preferred embodiment of the present invention is the same as an operation in which an operation related to the third counter/latch unit 303 is excluded from the operation in accordance with the third preferred embodiment, and thus a redundant description will not be repeated here.

Figure 19:
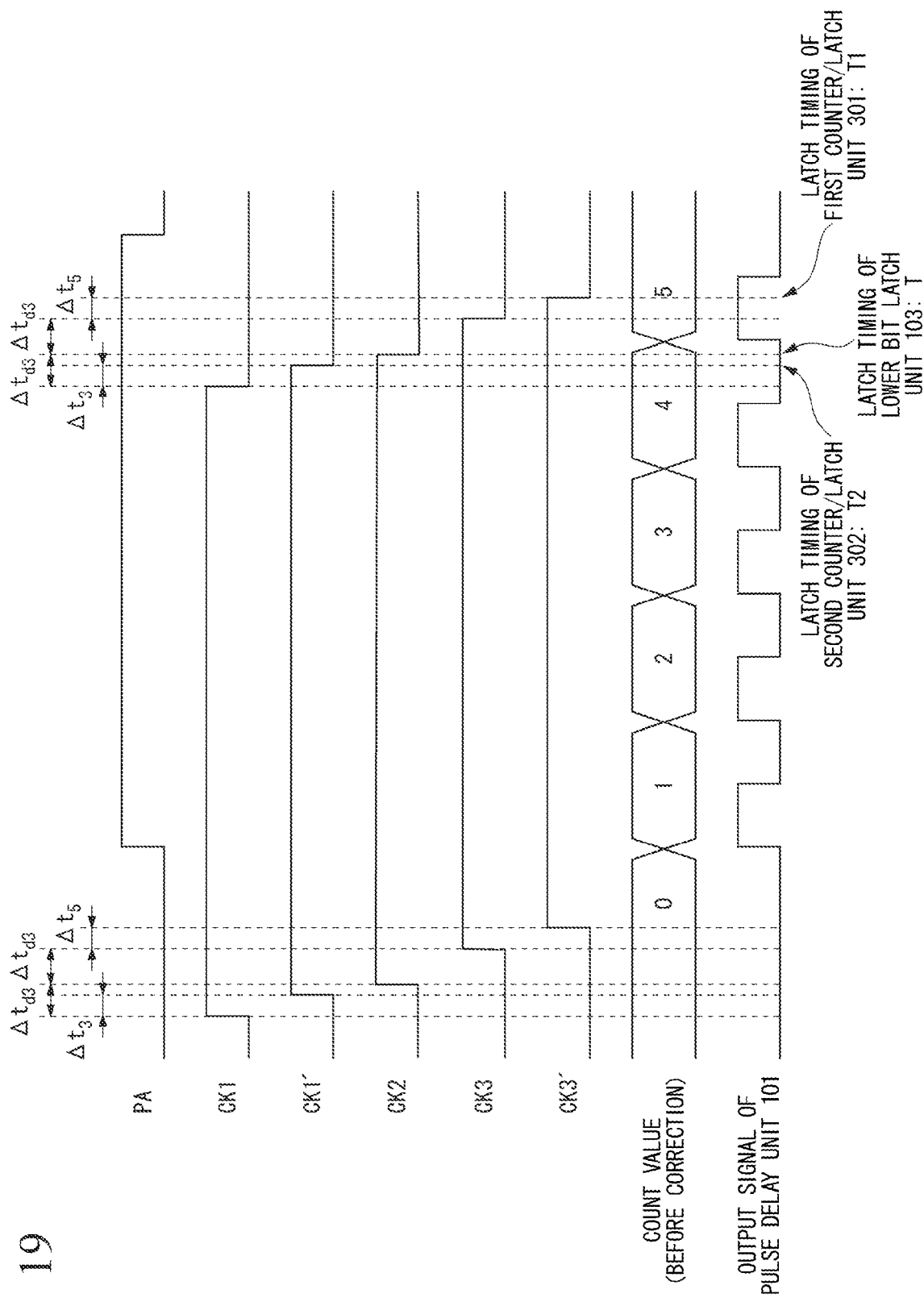
FIG. 19 is a timing chart illustrating an operation of the A/D converter arranged in the solid state image pickup device in accordance with the fifth preferred embodiment of the present invention.
Figure 20:
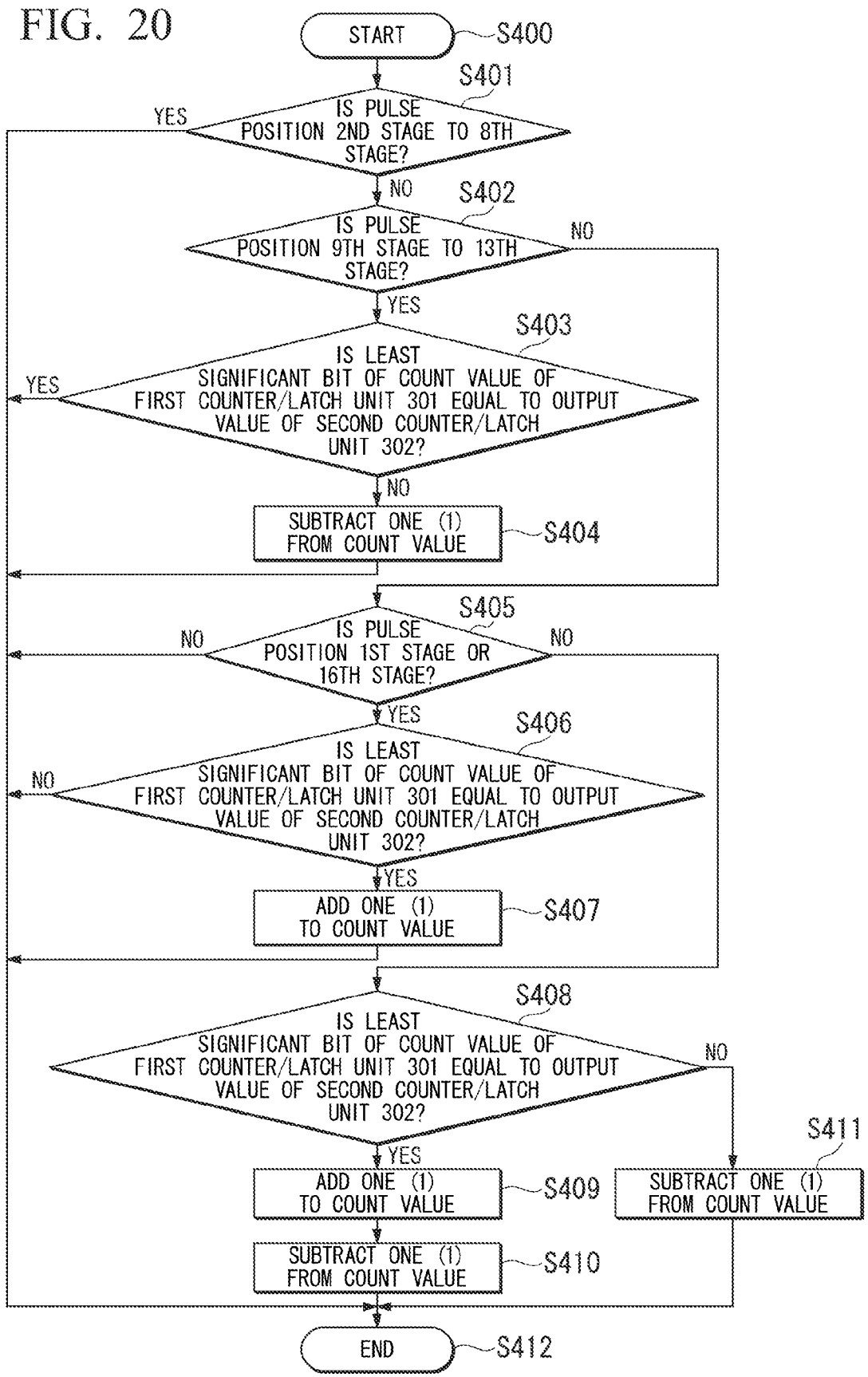
FIG. 20 is a flowchart illustrating an operation of the correcting unit arranged in the solid state image pickup device in accordance with the fifth preferred embodiment of the present invention.

Next, a correction process performed by the correcting unit 501 will be described with reference to FIGS. 19 and 20. FIG. 19 is a timing chart illustrating an operation of the A/D converter arranged in the solid state image pickup device in accordance with the fifth preferred embodiment of the present invention. FIG. 20 is a flowchart illustrating an operation of the correcting unit arranged in the solid state image pickup device in accordance with the fifth preferred embodiment of the present invention. After the A/D conversion time period ends as described above and the output signal of the lower bit latch unit 103 and the output signals of the first and second counter/latch units 301 and 302 are stored in the memory unit 006, in step S400, the correcting unit 501 starts the correction process. In step S401, the correcting unit 501 determines whether or not the pulse position in the pulse delay unit 101 is any one of the delay elements of the second to eighth stages in the pulse delay unit 101, based on the output signal of the lower bit latch unit 103 stored in the memory unit 006.

In the fifth preferred embodiment of the present invention, similarly to the first preferred embodiment, under the assumption that a timing at which the lower bit latch unit 103 latches the output signals R1 to R16 of the pulse delay unit 101 is a reference timing, the correcting unit 501 verifies whether or not the count value of the first counter/latch unit 301 is a value assumed to be a count value at a reference timing, and corrects the count value.

As illustrated in FIG. 19, a timing at which the lower bit latch unit 103 latches the output signals R1 to R16 of the pulse delay unit 101 is defined as a reference timing T, a timing at which the first counter/latch unit 301 latches the count value is defined as a latch timing T1, and a timing at which the second counter/latch unit 302 latches the count value is defined as a latch timing T2.

Since the time $\Delta t_{d3}$ by which the stop signal delay unit 502 delays the signal CK2 is a time corresponding to a quarter (¼) of the period of the pulse output from the pulse delay unit 101 when the highest analog input signal Vin is input to the pulse delay unit 101, when the pulse position in the pulse delay unit 101 at the reference timing T is disposed at the second to eighth stages of the delay element in the pulse delay unit 101, the pulse position at the latch timing T1 is disposed around one of the sixth to twelfth stages of the delay element in the pulse delay unit 101.

For this reason, the counter value of the first counter/latch unit 301 at the reference timing T becomes equal to the counter value of the first counter/latch unit 301 at the latch timing T1, and thus it is not necessary to correct the count value. When it is determined in step S401 that the pulse position in the pulse delay unit 101 is any one of the delay elements of the second to eighth stages in the pulse delay unit 101, the correcting unit 501 uses the count value of the first counter/latch unit 301 stored in the memory unit 006 as the upper bit, and in step S412, the correction process is finished.

Meanwhile, when it is determined in step S401 that the pulse position in the pulse delay unit 101 is none of the delay elements of the second to eighths stages in the pulse delay unit 101, in step S402, the correcting unit 501 determines whether or not the pulse position in the pulse delay unit 101 is any one of the delay elements of the ninth to thirteenth stages in the pulse delay unit 101, based on the output signal of the lower bit latch unit 103 stored in the memory unit 006. This determination corresponds to determination as to whether or not the count operation has stopped at a timing at which there is a possibility that an error will occur in the count value of the first counter/latch unit 301. When it is determined that the pulse position in the pulse delay unit 101 is any one of the delay elements of the ninth to thirteenth stages in the pulse delay unit 101, in step S403, the correcting unit 501 compares the least significant bit of the count value of the first counter/latch unit 301 stored in the memory unit 006 with the count value of the second counter/latch unit 302, and determines whether or not the two values are equal to each other.

Since the time $\Delta t_{d3}$ by which the stop signal delay unit 502 delays the signal CK2 is a time corresponding to a quarter (¼) of the period of the pulse output from the pulse delay unit 101 when the highest analog input signal Vin is input to the pulse delay unit 101, when the pulse position in the pulse delay unit 101 at the reference timing T is any one of the delay elements of the ninth to thirteenth stages in the pulse delay unit 101, the pulse position at the latch timing T1 is around any one of the delay elements of the thirteenth to sixteenth and first stages in the pulse delay unit 101. Thus, there is a possibility that at the latch timing T1, the first counter/latch unit 301 is in a state directly after the count operation is performed.

Meanwhile, since the pulse position at the latch timing T2 is around any one of the delay elements of the fifth to ninth stages in the pulse delay unit 101, the first counter/latch unit 301 does not perform the count operation between the latch timing T2 and the reference timing T. For this reason, the count value of the first counter/latch unit 301 at the latch timing T2 is equal to the count value of the first counter/latch unit 301 at the reference timing T.

In this regard, when the least significant bit of the count value of the first counter/latch unit 301 at the latch timing T1 is the same as the count value of the second counter/latch unit 302 at the latch timing T2, the count value of the first counter/latch unit 301 at the latch timing T1 can be regarded as the count value of the first counter/latch unit 301 at the reference timing T. However, when the least significant bit of the count value of the first counter/latch unit 301 at the latch timing T1 is different from the count value of the second counter/latch unit 302 at the latch timing T2, the count value of the first counter/latch unit 301 at the latch timing T1 has a surplus of one count and thus cannot be regarded as the count value of the first counter/latch unit 301 at the reference timing T. Thus, correction is necessary.

When it is determined in step S403 that the two values are equal to each other, the correcting unit 501 uses the count value of the first counter/latch unit 301 stored in the memory unit 006 as the upper bit, and in step S412, the correction process is finished. However, when the two values are not equal to each other, in step S404, the correcting unit 501 subtracts one from the count value of the first counter/latch unit 301 stored in the memory unit 006 and uses the resultant count value as the upper bit. Then, in step S412, the correction process is finished.

Meanwhile, when it is determined in step S402 that the pulse position in the pulse delay unit 101 is none of the delay elements of the ninth to thirteenth stages in the pulse delay unit 101, in step S405, the correcting unit 501 determines whether or not the pulse position in the pulse delay unit 101 is either of the delay elements of the first and sixteenth stages in the pulse delay unit 101. This determination corresponds to determination as to whether or not the count operation has stopped at a timing at which there is a possibility that an error will occur in the count value of the first counter/latch unit 301, similarly to the determination of step S402. When it is determined that the pulse position in the pulse delay unit 101 is either of the delay elements of the first and sixteenth stages in the pulse delay unit 101, in step S406, the correcting unit 501 compares the least significant bit of the count value of the first counter/latch unit 301 stored in the memory unit 006 with the count value of the second counter/latch unit 302, and determines whether or not the two values are equal to each other.

When the pulse position in the pulse delay unit 101 is either of the delay elements of the first and sixteenth stages in the pulse delay unit 101, the count value of the first counter/latch unit 301 at the reference timing T is a value directly after the count operation is performed. Since the time $\Delta t_{d3}$ by which the stop signal delay unit 502 delays the signal CK1 is a time corresponding to a quarter (¼) of the period of the pulse, the count value of the second counter/latch unit 302 at the latch timing T2 is a value before the count operation is performed. Thus, the least significant bit of the count value of the first counter/latch unit 301 at the reference timing T is different from the count value of the second counter/latch unit 302 at the latch timing T2.

Meanwhile, since the time $\Delta t_{d3}$ by which the stop signal delay unit 502 delays the signal CK2 is a time corresponding to a quarter (¼) of the period of the pulse, the first counter/latch unit 301 performs the count operation directly before the reference timing T, and then does not perform the count operation between the reference timing T and the latch timing T1 as described above. Thus, the counter value of the first counter/latch unit 301 at the reference timing T is equal to the counter value of the first counter/latch unit 301 at the latch timing T1. That is, the least significant bit of the counter value of the first counter/latch unit 301 at the latch timing T1 is different from the counter value of the second counter/latch unit 302 at the latch timing T2.

In this regard, when the least significant bit of the count value of the first counter/latch unit 301 at the latch timing T1 is different from the count value of the second counter/latch unit 302 at the latch timing T2, the count value of the first counter/latch unit 301 at the latch timing T1 can be regarded as the count value of the first counter/latch unit 301 at the reference timing T. However, when the least significant bit of the count value of the first counter/latch unit 301 at the latch timing T1 is equal to the count value of the second counter/latch unit 302 at the latch timing T2, the count value of the first counter/latch unit 301 at the latch timing T1 is short one count and thus cannot be regarded as the count value of the first counter/latch unit 301 at the reference timing T. Thus, correction is necessary.

When it is determined in step S406 that the two values are equal to each other, in step S407, the correcting unit 501 adds one to the count value of the first counter/latch unit 301 stored in the memory unit 006 and uses the resultant count value as the upper bit, and in step S412, the correction process is finished. However, when the two values are not equal to each other, the correcting unit 501 uses the count value of the first counter/latch unit 301 stored in the memory unit 006 as the upper bit. Then, in step S412, the correction process is finished.

Meanwhile, when it is determined in step S405 that the pulse position in the pulse delay unit 101 is neither of the delay elements of the first and thirteenth stages in the pulse delay unit 101, it is determined that the pulse position in the pulse delay unit 101 is either of the delay elements of the fourteenth and fifteenth stages in the pulse delay unit 101. Subsequently, in step S408, the correcting unit 501 compares the least significant bit of the count value of the first counter/latch unit 301 stored in the memory unit 006 with the count value of the second counter/latch unit 302, and determines whether or not the two values are equal to each other.

When the pulse position in the pulse delay unit 101 is either of the delay elements of the fourteenth and fifteenth stages in the pulse delay unit 101, the count value of the first counter/latch unit 301 at the reference timing T is a value directly before the count operation is performed. Since the time $\Delta t_{d3}$ by which the stop signal delay unit 502 delays the signal CK1 is a time corresponding to a quarter (¼) of the period of the pulse, the count value of the second counter/latch unit 302 at the latch timing T2 is a value before the count operation is performed. Further, since the time $\Delta t_{d3}$ by which the stop signal delay unit 502 delays the signal CK2 is a time corresponding to a quarter (¼) of the period of the pulse, the count value of the first counter/latch unit 301 at the latch timing T1 is a value after the count operation is performed. Thus, the least significant bit of the count value of the first counter/latch unit 301 at the latch timing T1 is different from the count value of the second counter/latch unit 302 at the latch timing T2.

In this regard, when the least significant bit of the count value of the first counter/latch unit 301 at the latch timing T1 is different from the count value of the second counter/latch unit 302 at the latch timing T2, no error occurs in the count value of the first counter/latch unit 301 at the latch timing T1. However, when the least significant bit of the count value of the first counter/latch unit 301 at the latch timing T1 is equal to the count value of the second counter/latch unit 302 at the latch timing T2, an error of one count occurs in the count value of the count value of the first counter/latch unit 301 at the latch timing T1. Thus, correction is necessary.

Further, the count value of the first counter/latch unit 301 at the reference timing T is a value directly before the count operation is performed, and the count value of the first counter/latch unit 301 at the latch timing T1 is a value after the count operation is performed. Thus, the count value of the first counter/latch unit 301 at the reference timing T is a value obtained by subtracting one from the count value of the first counter/latch unit 301 at the latch timing T1.

When it is determined in step S408 that the two values are equal to each other, in step S409, the correcting unit 501 adds one to the count value of the first counter/latch unit 301 stored in the memory unit 006. Further, in step S410, the correcting unit 501 subtracts one from the count value and uses the resultant count value as the upper bit. Then, in step S412, the correction process is finished. The addition process of step S409 is a process of correcting an error of one count, and the subtraction process of step S410 is a process for converting the count value of the first counter/latch unit 301 at the latch timing T1 into the count value of the first counter/latch unit 301 at the reference timing T.

Meanwhile, when the two values are not equal to each other, in step S411, the correcting unit 501 subtracts one from the count value of the first counter/latch unit 301 stored in the memory unit 006 and uses the resultant count value as the upper bit. Then, in step S412, the correction process is finished. The subtraction process of step S411 is a process for converting the count value of the first counter/latch unit 301 at the latch timing T1 into the count value of the first counter/latch unit 301 at the reference timing T.

In FIG. 19, the count values at the latch timing T2 and the reference timing T are 4, and the count value at the latch timing T1 is 5. In this case, the count value at the reference timing T is calculated such that in step S408, it is determined that the two values are not equal to each other, and in step S411, one is subtracted from the count value at the latch timing T1.

As described above, according to the fifth preferred embodiment of the present invention, by comparing the least significant bit of the count value of the first counter/latch unit 301 with the counter value of the second counter/latch unit 302 and correcting the count value based on the comparison result and the pulse position in the pulse delay unit 101 (the output signal of the lower bit latch unit 103), it is possible to obtain the count value when the lower bit latch unit 103 latches the output signal R1 to R16 of the pulse delay unit 101, and thus A/D conversion can be performed with a high degree of accuracy. Further, since the number of bits of the second counter/latch unit 302 can be reduced to be smaller than the number of bits of the first counter/latch unit 301, an increase in the size of the solid state image pickup device can be minimally-suppressed.

Sixth Preferred Embodiment

Figure 21:
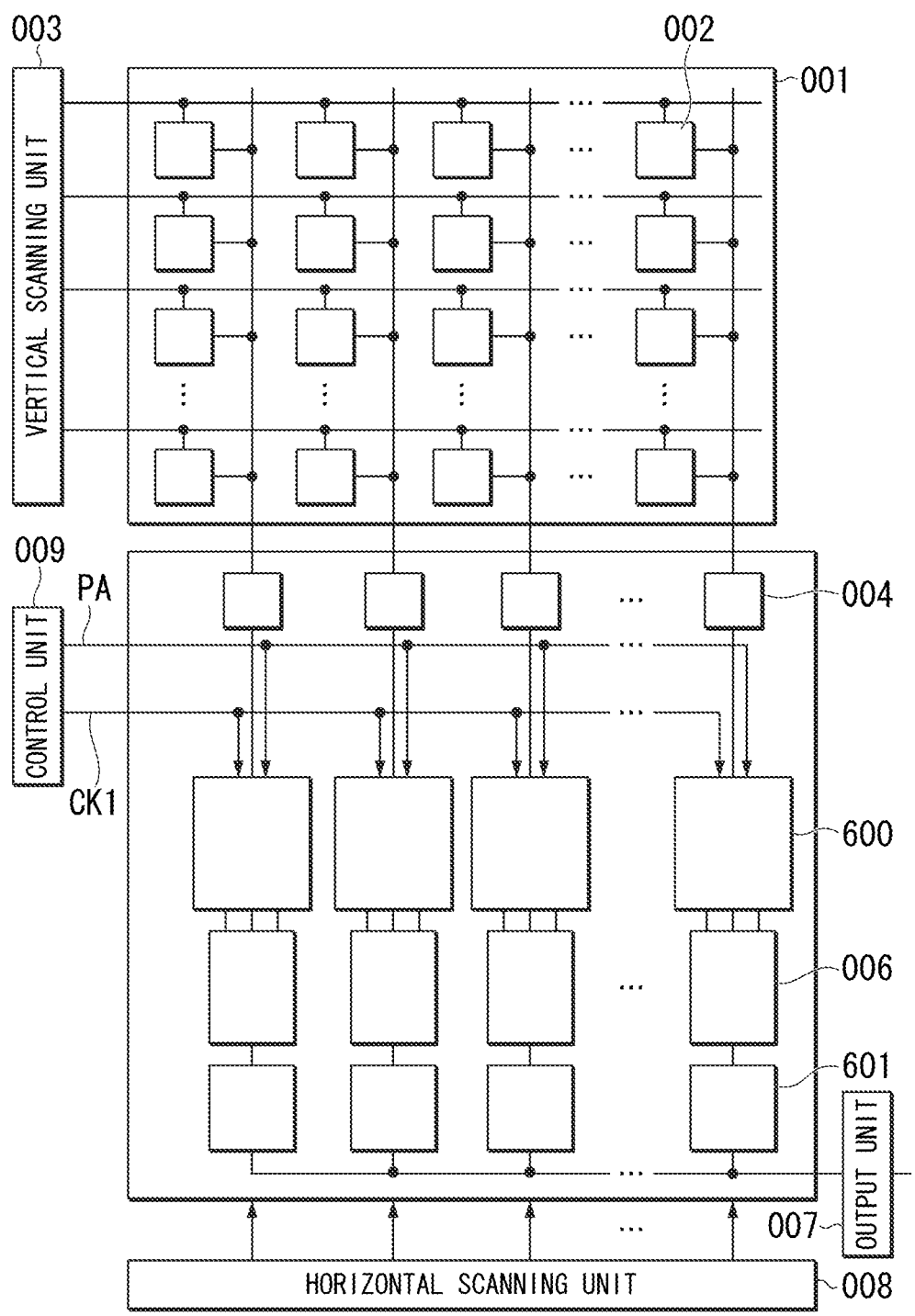
FIG. 21 is a block diagram illustrating a configuration of a solid state image pickup device in accordance with a sixth preferred embodiment of the present invention.
Figure 22:
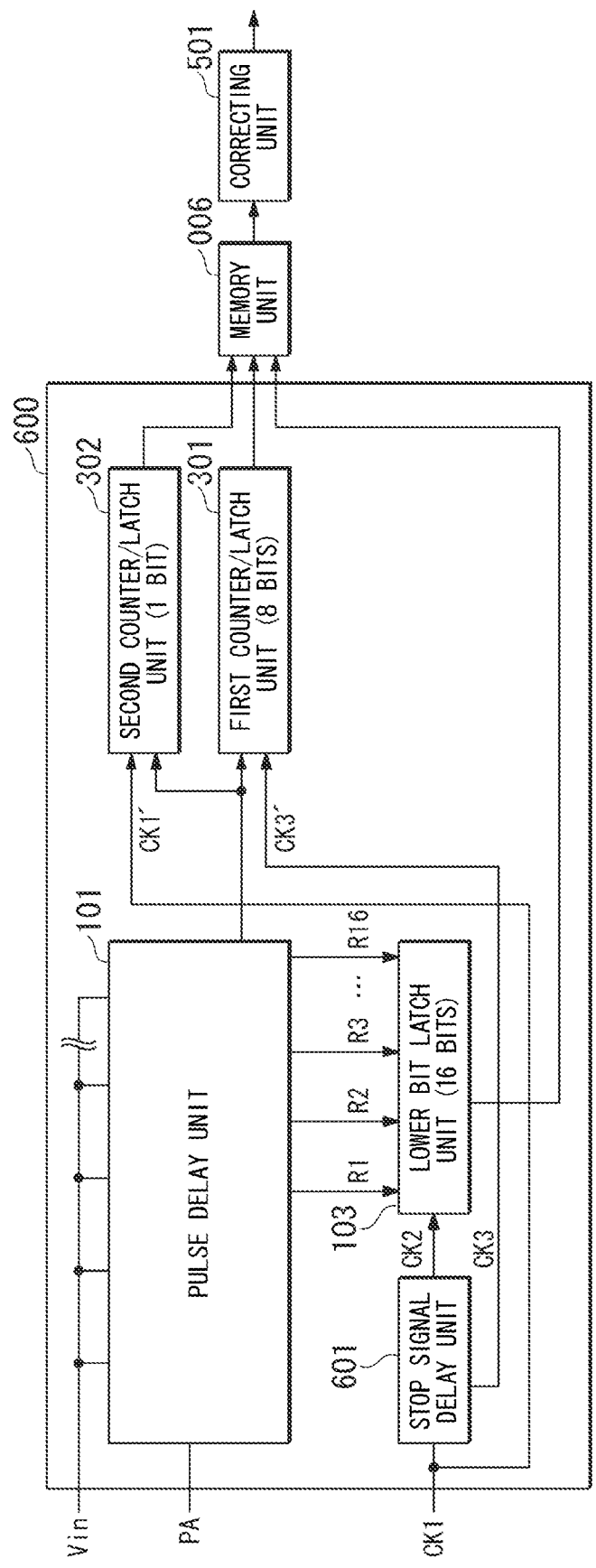
FIG. 22 is a block diagram illustrating a configuration of an A/D converter arranged in the solid state image pickup device in accordance with the sixth preferred embodiment of the present invention.

A sixth preferred embodiment of the present invention will be described. FIG. 21 is a block diagram illustrating a configuration of a solid state image pickup device in accordance with the sixth preferred embodiment of the present invention. FIG. 22 is a block diagram illustrating a configuration of an A/D converter 600 arranged in the solid state image pickup device in accordance with the sixth preferred embodiment of the present invention. Among components illustrated in FIGS. 21 and 22, the same components as in the solid state image pickup device and the A/D converter described above are denoted by the same reference numerals, and thus a redundant description will not be repeated here. Further, each configuration and operation in accordance with the sixth preferred embodiment of the present invention will be described below focusing on the differences with the fifth preferred embodiment.

A relation between the fifth preferred embodiment and the sixth preferred embodiment of the present invention corresponds to a relation between the first preferred embodiment and the second preferred embodiment of the present invention or a relation between the third preferred embodiment and the fourth preferred embodiment of the present invention. The difference between the fifth preferred embodiment and the sixth preferred embodiment of the present invention lies in that the A/D converter 500 is replaced with an A/D converter 600, the stop signal delay unit 502 is replaced with a stop signal delay unit 601, the stop signal delay unit 601 is arranged in each A/D converter 600, and the analog input signal Vin is input to the stop signal delay unit 601.

The stop signal delay unit 601 is configured by 8 delay units (8 stages). A signal CK2 output from the stop signal delay unit 601 is an output signal of a delay unit DE of a fourth stage, and a signal CK3 output from the stop signal delay unit 601 is an output signal of a delay unit DE of an eighth stage. That is, the signal CK2 always remains delayed from the signal CK1 by a quarter (¼) of the period of the output signal of the pulse delay unit 101, and the signal CK3 always remains delayed from the signal CK1 by half the period of the output signal of the pulse delay unit 101.

Operations of the A/D converter 600 and the correcting unit 501 are the same as in the A/D converter 500 and the correcting unit 501 in accordance with the fifth preferred embodiment, and thus a redundant description will not be repeated here.

As described above, according to the sixth preferred embodiment of the present invention, since the stop signal delay unit 601 is driven by the analog input signal Vin, even when the period of the output signal of the pulse delay unit 101 significantly changes, an optimum delay time can be set, and A/D conversion can be performed with a high degree of accuracy in response to a wider change in the analog input signal Vin.

The exemplary preferred embodiments of the present invention have been described hereinbefore. The present invention is not limited to the above preferred embodiments. It should be understood that various modification or applications can be made within a range of the gist of the present invention. For example, in the first and second preferred embodiments, the first upper bit latch unit 105 may be configured by a two- or more-bit circuit, however, when the first upper bit latch unit 105 is configured by a 1-bit circuit, a minimal configuration is obtained. Similarly, in the third to sixth preferred embodiments, the second counter/latch unit 302 and the third counter/latch unit 303 may be configured by a two- or more-bit circuit, however, when the second counter/latch unit 302 and the third counter/latch unit 303 are configured by a 1-bit circuit, a minimal configuration is obtained.

Further, the above preferred embodiments have been described in connection with the example in which the time by which the stop signal delay unit delays the signal CK1 is a time corresponding to half or a quarter (¼) of the period of the output signal of the pulse delay unit 101 when the highest analog input signal Vin is input to the pulse delay unit 101. However, the time by which the stop signal delay unit delays the signal CK1 is not limited thereto and may be changed according to the number of stages of the delay elements in the pulse delay unit determined by the correcting unit. In the case of the first preferred embodiment, the time by which the stop signal delay unit delays the signal CK1 may be a delay time corresponding to the delay elements of 3 to 14 stages when the highest analog input signal Vin is input to the pulse delay unit 101, and the same effect may be obtained.

In addition, in the first and second preferred embodiments, the output signal of the first upper bit latch unit 105 may be output to the memory unit 006, and the correcting unit 013 may perform determination using only signals in the memory unit 006, and the same effect may be obtained.

Furthermore, the present invention is not limited to the example in which the pixel signal output line of the solid state image pickup device is arranged in units of columns. For example, one pixel signal output line may be shared by a plurality of pixel units, and the pixel signal line may be arranged in units of two or more columns, and the same effect may be obtained.

While preferred embodiments of the present invention have been described and illustrated above, it should be understood that these are examples of the present invention and are not to be considered as limiting. Additions, omissions, substitutions, and other modifications can be made without departing from the scope of the present invention. Accordingly, the invention is not to be considered as being limited by the foregoing description, and is only limited by the scope of the claims.

What is claimed is:

1. A solid state image pickup device comprising:
    a pixel unit that includes a plurality of pixels arranged in the form of a matrix, each of the plurality of pixels generating a pixel signal, the pixel signal being output from a plurality of pixel signal output lines arranged to correspond to a column of the plurality of pixels;
    a pulse delay unit that includes a plurality of delay elements connected in a ring form, each of the plurality of delay elements including a power supply terminal that is connected to one of the plurality of pixel signal output lines, one of the plurality of delay elements including an input terminal that receives a pulse, each of the plurality of delay elements transferring the pulse with a delay time corresponding to the pixel signal;
    a stop control unit that outputs a stop signal when a predetermined time elapses after the pulse delay unit receives the pulse;
    a stop signal delay unit that outputs a delay stop signal delayed from the stop signal;
    a lower bit latch unit that latches output signals of the plurality of delay elements when receiving the delay stop signal;
    a counter unit that counts a circulation number of the pulse based on an output signal of one of the plurality of delay elements;
    a first upper bit latch unit that latches at least a least significant bit of an output signal of the counter unit when receiving the delay stop signal;
    a second upper bit latch unit that latches the output signal of the counter unit when receiving the delay stop signal; and
    a correcting unit that compares an output signal of the first upper bit latch unit with an output signal of the second upper bit latch unit, and corrects a count value, which is a count result of the counter unit, based on a comparison result and an output signal of the lower bit latch unit.

2. The solid state image pickup device according to claim 1, wherein the first upper bit latch unit latches only the least significant bit of the output signal of the counter unit.

3. The solid state image pickup device according to claim 1, wherein the stop signal delay unit is connected to the plurality of lower bit latch units and the plurality of second upper bit latch units.

4. The solid state image pickup device according to claim 1, wherein the stop signal delay unit controls a delay amount for delaying the stop signal based on the pixel signal.

5. A solid state image pickup device comprising:
a pixel unit that includes a plurality of pixels arranged in the form of a matrix, each of the plurality of pixels generating a pixel signal, the pixel signal being output from a plurality of pixel signal output lines arranged to correspond to a column of the plurality of pixels;
a pulse delay unit that includes a plurality of delay elements connected in a ring form, each of the plurality of delay elements including a power supply terminal that is connected to one of the plurality of pixel signal output lines, one of the plurality of delay elements including an input terminal that receives a pulse, each of the plurality of delay elements transferring the pulse with a delay time corresponding to the pixel signal;
a stop control unit that outputs a stop signal when a predetermined time elapses after the pulse delay unit receives the pulse;
a stop signal delay unit that outputs a first delay stop signal delayed from the stop signal and a second delay stop signal delayed from the first delay stop signal;
a lower bit latch unit that latches output signals of the plurality of delay elements when receiving the first delay stop signal;
a first counter/latch unit that counts a circulation number of the pulse based on an output signal of one of the plurality of delay elements, and latches the circulation number when receiving the first delay stop signal;
a second counter/latch unit that is smaller in the number of bits than the first counter/latch unit, counts a circulation number of the pulse based on an output signal of one of the plurality of delay elements, and latches the circulation number when receiving the stop signal;
a third counter/latch unit that is smaller in the number of bits than the first counter/latch unit, counts a circulation number of the pulse based on an output signal of one of the plurality of delay elements, and latches the circulation number when receiving the second delay stop signal; and
a correcting unit that compares an output signal of the first counter/latch unit, an output signal of the second counter/latch unit, and an output signal of the third counter/latch unit, and corrects a count value, which is a count result of the first counter/latch unit, based on a comparison result and an output signal of the lower bit latch unit.

6. The solid state image pickup device according to claim 5, wherein the number of bits of the second counter/latch unit and the third counter/latch unit is one.

7. The solid state image pickup device according to claim 5, wherein the stop signal delay unit is connected to the plurality of lower bit latch units, the plurality of first counter/latch units, and the plurality of third counter/latch units.

8. The solid state image pickup device according to claim 5, wherein the stop signal delay unit controls a delay amount for delaying the stop signal and the first delay stop signal based on the pixel signal.

9. A solid state image pickup device comprising:
a pixel unit that includes a plurality of pixels arranged in the form of a matrix, each of the plurality of pixels generating a pixel signal, the pixel signal being output from a plurality of pixel signal output lines arranged to correspond to a column of the plurality of pixels;
a pulse delay unit that includes a plurality of delay elements connected in a ring form, each of the plurality of delay elements including a power supply terminal that is connected to one of the plurality of pixel signal output lines, one of the plurality of delay elements including an input terminal that receives a pulse, each of the plurality of delay elements transferring the pulse with a delay time corresponding to the pixel signal;
a stop control unit that outputs a stop signal when a predetermined time elapses after the pulse delay unit receives the pulse;
a stop signal delay unit that outputs a first delay stop signal delayed from the stop signal and a second delay stop signal delayed from the first delay stop signal;
a lower bit latch unit that latches output signals of the plurality of delay elements when receiving the first delay stop signal;
a first counter/latch unit that counts a circulation number of the pulse based on an output signal of one of the plurality of delay elements, and latches the circulation number when receiving the second delay stop signal;
a second counter/latch unit that is smaller in the number of bits than the first counter/latch unit, counts a circulation number of the pulse based on an output signal of one of the plurality of delay elements, and latches the circulation number when receiving the stop signal;
a correcting unit that compares an output signal of the first counter/latch unit with an output signal of the second counter/latch unit, and corrects a count value, which is a count result of the first counter/latch unit, based on a comparison result and an output signal of the lower bit latch unit.

10. The solid state image pickup device according to claim 9, wherein the number of bits of the second counter/latch unit is one.

11. The solid state image pickup device according to claim 9, wherein the stop signal delay unit is connected to the plurality of lower bit latch units and the plurality of first counter/latch units.

12. The solid state image pickup device according to claim 9, wherein the stop signal delay unit controls a delay amount for delaying the stop signal based on the pixel signal.

* * * * *